(12) United States Patent
Bailey et al.

(10) Patent No.: US 9,232,678 B2
(45) Date of Patent: Jan. 5, 2016

(54) MODULAR, SCALABLE, EXPANDABLE, RACK-BASED INFORMATION HANDLING SYSTEM

(71) Applicant: DELL, INC., Round Rock, TX (US)

(72) Inventors: Edmond Bailey, Cedar Park, TX (US); John R. Stuewe, Round Rock, TX (US); Paul W. Vancil, Austin, TX (US); Kunrong Wang, Austin, TX (US); German Florez-Larrahondo, Georgetown, TX (US); Jimmy Pike, Georgetown, TX (US); Stephen P. Rousset, Round Rock, TX (US); Joseph Vivio, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 172 days.

(21) Appl. No.: 14/143,846

(22) Filed: Dec. 30, 2013

(65) Prior Publication Data

US 2015/0189787 A1 Jul. 2, 2015

(51) Int. Cl.
| H05K 5/00 | (2006.01) |
| H05K 7/00 | (2006.01) |
| G06F 1/16 | (2006.01) |
| H05K 7/14 | (2006.01) |
| H05K 7/20 | (2006.01) |

(52) U.S. Cl.
CPC ............ *H05K 7/1489* (2013.01); *H05K 7/1492* (2013.01); *H05K 7/20736* (2013.01)

(58) Field of Classification Search
CPC .............. G06F 1/20; G06F 1/206; H05K 5/00; H05K 5/02; H05K 7/1489; H05K 7/1492
USPC ............................. 361/688, 679.48, 724–727
See application file for complete search history.

(56) References Cited

U.S. PATENT DOCUMENTS

| 7,457,112 B2 * | 11/2008 | Fukuda et al. ............ 361/679.48 |
| 8,081,441 B2 * | 12/2011 | Zhang et al. .............. 361/679.33 |
| 9,019,706 B2 * | 4/2015 | Ning et al. ...................... 361/724 |
| 9,019,707 B2 * | 4/2015 | Xu et al. ......................... 361/724 |
| 2002/0046979 A1 | 4/2002 | Larsen et al. |
| 2003/0223192 A1 | 12/2003 | Searby et al. |
| 2004/0257766 A1 | 12/2004 | Rasmussen et al. |
| 2012/0116590 A1 | 5/2012 | Florez-Larrahondo |
| 2013/0141863 A1 | 6/2013 | Ross et al. |
| 2013/0198534 A1 | 8/2013 | Bailey et al. |

FOREIGN PATENT DOCUMENTS

| CN | 102510344 A | 6/2012 |
| DE | 202012103372 U1 | 10/2012 |

* cited by examiner

*Primary Examiner* — Anthony Haughton
(74) *Attorney, Agent, or Firm* — Isidore PLLC

(57) ABSTRACT

A modular, scalable and expandable (MSE) rack-based information handling system (RIHS) includes: a rack assembly having a frame that defines: a front bay chassis with height, depth and width dimensions that enable insertion of a plurality of different sizes of IT gear; and a rear bay that accommodates power and cooling components to support operation of the different sizes of IT gear. The power and cooling for the IT gear are provided from the rear bay and are separate from and independent of the IT gear installed within the front bay chassis. The rack assembly further includes a power and management chassis in which is inserted a power and management module having power and management components located thereon to provide rack-level power and management. A modular configuration of fan modules are inserted within fan receptacles within the rear bay to provide block level cooling of adjacent blocks of IT gear.

27 Claims, 15 Drawing Sheets

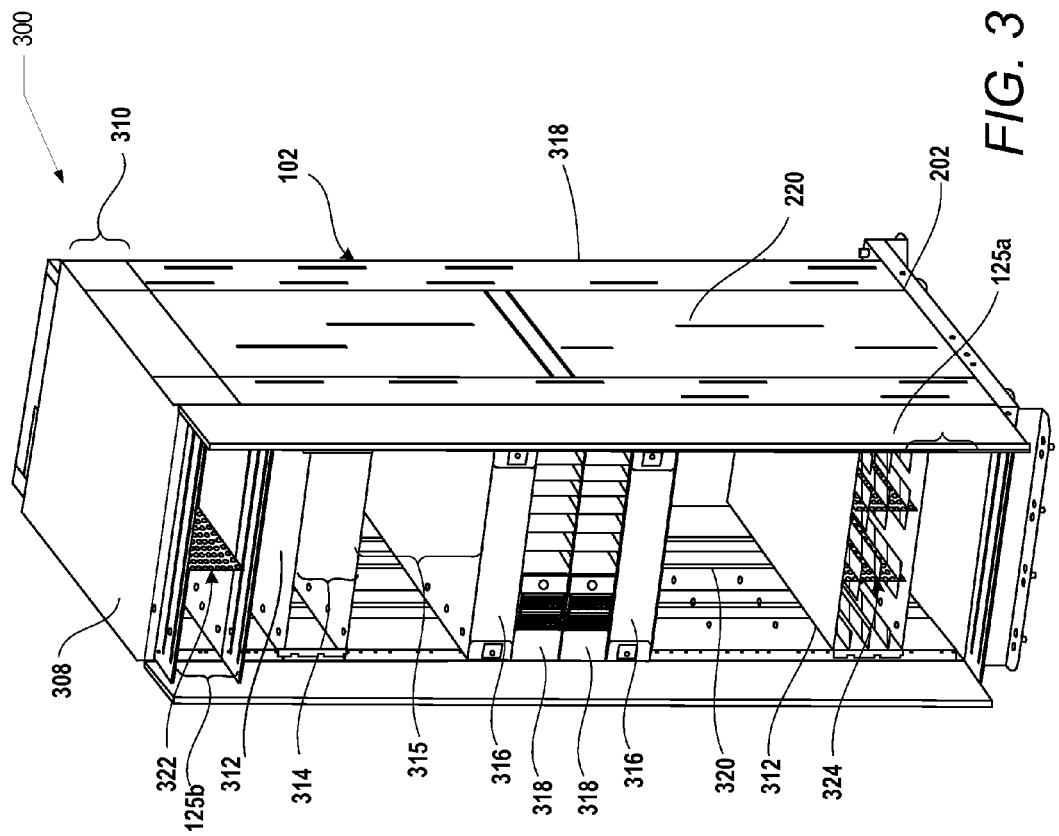
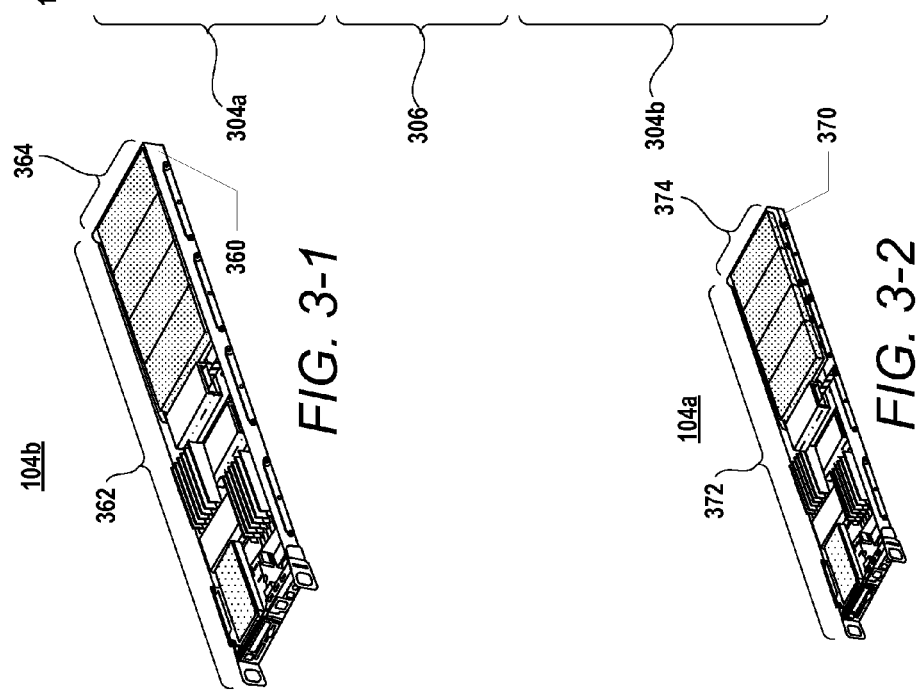

MODULAR, SCALABLE, EXPANDABLE, RACK-BASED INFORMATION HANDLING SYSTEM

PRIORITY DESIGNATION

The present disclosure is related to and claims the benefit of the filing date of commonly assigned U.S. patent application Ser. No. 14/139,812 filed on Dec. 23, 2013.

BACKGROUND

1. Technical Field

The present disclosure generally relates to information handling systems and in particular to modular, scalable and expandable rack-based information handling systems and design.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Rack-based information handling systems enable larger scale systems to be deployed in a single structure, referred to in the industry as a rack. These racks can hold a plurality of individual servers or server nodes (generally, "IT gear"), which can be fully functional units. These individual units function as self-managed systems and are thus each equipped with individual cooling and power controls and localized system management, independent of other systems within the rack. These IT gear are also designed to fit within the specific rack configuration, and are thus typically of a standard width and depth dimension to fit within the rack structure. Also, depending on the particular rack, the IT gear are design with a standard uniform height that is determined solely by the pre-determined singular height of IT gear the specific rack is design to have inserted therein.

BRIEF SUMMARY

Disclosed are an information handling system rack and corresponding rack-based information handling system that are modular, scalable, and expandable, and which provide rack-level control and management of certain power, cooling, and communication functions of the overall rack system. According to one aspect of the disclosure, a modular, scalable, and expandable (MSE) rack-based IHS includes: a rack assembly having a frame that defines: (1) a front bay chassis with height, depth and width dimensions that enable insertion and retention of a plurality of different sizes of IT gear and which provides a plurality of individual blocks of a pre-defined height; and (2) a rear bay that accommodates power and cooling components to support operation of the different sizes of IT gear, where the power and cooling components are provided separate from and independent of the actual size of IT gear installed within the front bay chassis and are assigned at a block level. The frame of the rack assembly further defines or includes: (3) a power and management bay for receiving one or more power and management components and extending from the front bay chassis into the rear bay; and (4) a switch bay for receiving one or more switches and extending from the front bay chassis into the rear bay.

The MSE RIHS further includes: a plurality of information technology (IT) gear contained within one or more IT sleds slide-ably inserted into one or more blocks of the front bay chassis; one or more sleds providing a switch and inserted into the switch bay; one or more power and management sleds providing a combined power and management module (PMM) and inserted into the power and management bay; and a rack-level management controller (MC) having firmware that enables the MC to control power allocation and cooling operations for the plurality of IT gear from a rack-level. The MC is collocated on the PMM, and a redundant MC configuration is provided in one embodiment.

The MSE RIHS also includes: a plurality of block controllers each assigned to a specific block of IT gear contained in a block chassis and capable of triggering control operations for the IT gear contained within the specific block; and an infrastructure manager (IM) communicatively coupled to the MC and to each of the plurality of block controllers and which provides rack-level control signals to the plurality of block controllers and receives operational data of the IT gear from the block controllers. The IM is also collocated on the PMM.

Additionally, the rear bay of the MSE RIHS provides: at least one fan cabinet located adjacent to a back section of an adjacent block chassis within the front bay chassis; and at least one fan module insertably placed within the fan cabinet and communicatively coupled to the block controller of the adjacent block to provide block level cooling of IT gear inserted within the IT block.

Also, the MSE RIHS further includes a power distribution system that includes: one or more power supply units (PSUs) contained in the power bay module extending from the front bay chassis to the rear chassis and which provides electrical power for the IT gear and other functional components contained within the RIHS; a power distribution component electrically coupled to the one or more PSUs; a modular bus bar assembly electrically coupled between the power distribution component and a rear cabinet space of the block chassis; and one or more power interface boards contained in the block chassis inserted within the front bay chassis, the power interface board electrically coupled to the modular bus bar assembly and to the IT gear contained within the block chassis.

The MSE RIHS includes opposing, extendable and retractable side sleeves that can be pulled to an extended position to protect the extended portion of the at least one longer IT sled, wherein the sleeves are retractable within the rack chassis when not required for insertion of standard length IT sleds. Also, the plurality of IT gear supported by the MSE RIHS includes a hybrid combination of IT gear having one or more of different height, width, and length that are all accommodated within respective IT sleds inserted within a block chassis of the MSE RIHS. The different height, width, and length IT gear are accommodated using a combination of peripheral attachments and affordances provided within the rack chassis and use of a segmented power bus bar to allow a horizontal bus bar affixed to each IT sled to electrically connect to and receive system power at the rear of the front bay once the IT sled is fully inserted into the front bay.

According to one aspect, also disclosed is an MSE rack assembly for physically supporting information technology (IT) gear of one or more information handling systems (IHSes), the IT gear having different dimensions of at least one of height, width, and depth. The MSE rack assembly includes: a rack chassis comprising a plurality of interconnected panels forming a volumetric space having a front section and a rear section, both with opposing side panels forming a front access space and a rear access space, respectively, between corresponding opposing side panels; a plurality of guides located within interior surfaces of the opposing side panels at the front section, the plurality of guides running in a lateral direction along the front access space towards the rear section; and one or more block chasses each having a frame that provides a block height, which enables insertion of at least one layer of N fully functional IT gears within the block chassis, the frame defining a corresponding information technology (IT) bay, having a total width that enables attachment to opposing guides on the opposing side panels and configured to support insertion of one or more IT gears having at least a first size dimension selectable from among multiple supported height, width, and depth dimensions ranging from a fractional or partial width, height and depth dimension to a full height, full width, and full depth dimension of IT gear insertable into the particular block chassis. The block chassis is physically inserted into the front section of the rack chassis and held in place by at least two opposing guides on the opposing side panels.

As one feature of the modularity of the MSE rack assembly, in addition to the above described power and management and cooling systems and corresponding rack chassis configuration, the MSE RIHS includes a plurality of attachments on opposing side rails of the opposing side panels which enable slide-able insertion and removal of one of a single unit height IT gear and a block chassis that has greater than a single unit height. The plurality of attachments are vertically spaced at one of (a) single unit heights corresponding to a smallest height IT gear and (b) larger units of height to accommodate insertion of different heights of IT gear. Additionally, or alternatively, each of the plurality of guides along each panel of the opposing side panels are separated from a closest adjacent guide by at least a first unit of height that is sufficient to accommodate insertion of a smallest standard height information technology (IT) gear chassis within the front section. The guides are designed to enable insertion of at least one second height IT gear chassis that is larger than the smallest standard height, to enable the rack assembly to simultaneously accommodate multiple different heights of IT gear chasses within the front section of the rack assembly.

According to one aspect, a height of a block chassis is substantially equal to a whole number multiple of a sled height of a smallest standard height IT gear; and when the IT gear is a first height that is less than the block height, the block chassis can support insertion of two or more vertically adjacent layers of IT gear, which are controlled by a single block controller assigned to that block defined by the block chassis.

Also, the MSE rack assembly can concurrently include: at least one standard height IT gear sled slide-ably inserted into a first segment of the front access space between adjacent guides on opposing side panels of the front section; and at least one second height IT gear chassis slide-ably inserted into a second segment of the front access space between non-adjacent guides on opposing side panels of the front section.

Additionally, with respect to the different widths of IT gear, the block chassis enables insertion of a select one of multiple different widths of IT gear ranging from a full width IT gear to a fractional (1/N) width IT gear, where N is an integer greater than 1. When N is equal to 1, the MSE rack assembly includes full width IT gear. When N is equal to 2, the MSE rack assembly includes at least one block chassis having one or more layers of two (2) side-by-side fully functional IT gears inserted therein. The two side-by-side fully functional IT gears comprise two one-half width IT gear that are one half a size of a standard width IT gear. When N is equal to 3, the MSE rack assembly comprises at least one block chassis having one or more layers of three (3) side-by-side fully functional IT gears inserted therein. The three side-by-side fully functional IT gears comprise three one-third widths IT gear that are one third a size of a standard width IT gear. The block chassis also enables a hybrid arrangement of IT gear including at least two different widths of IT gear from among the multiple different widths of IT gear, in different sled layers within the one block chassis, where each sled layer includes only a single-sized width IT gear.

According to another aspect, several different lengths IT gear are supported via a system of sleeves and expansion panels and retractable cable connectors. Thus, the MSE rack assembly can include: at least one IT sled that extends to a first depth within the front space of the rack chassis when inserted within the front access space; and a retractable cable connector that connects to a back portion of the IT sled and which extends to an extended position when the IT sled is removed from the block chassis to a service position and which retracts to a closed position when the IT sled is slid back into the block chassis. Alternatively, the cable connector can serve as an extension for the IT gear that only partially extends into the IT sled when fully inserted. The sled is designed to be standard length so as to electrically connect with the power busbar extended along the back of the front bay. The MSE rack assembly can also include side sleeves at each block that can be pulled to an extended position to protect the extended portion of the longer IT sled. The sleeves are retractable within the rack chassis when not required for standard length IT sleds.

In one embodiment, the MSE rack assembly includes: at least one attachment affordance provided at each of the opposing side panels at the front section and the back section; and a pair of front expansion panels that are affixed to the rack chassis via the at least one attachment affordance and which extend past an end of the opposing side panels at the front section of the rack chassis to provide a deeper IT bay within the front section and enable insertion of longer-than-standard depth IT gear within the rack chassis. The pair of front expansion panels is removably affixed via connecting affordances to the opposing side panels. The pair of front expansion panels extend past an exposed end of one or more IT sleds that extend past the opposing side panels when fully inserted to protect an extended section of the one or more IT sleds. In at least one embodiment, the pair of front expansion panels are cable management panels having one or more cable straps that enable collection and bundling of communication and power cables for IT gear located within the front access space at which the cable management extensions are attached. Also, in one or more embodiments, the MSE rack assembly includes at least one security screen that is removably affixed to opposing edges of the two front expansion panels to shield the IT components inserted within a space extending behind the security screen from physical access while the screen is affixed.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 3 illustrates a front isometric view of the example rack of FIG. 2 after insertion of the building block components and physical block separators for the rack to operate as an MSE RIHS, according to one embodiment;

FIGS. 3-1 and 3-2 illustrate example one half width and one third width IT gear that can be inserted into corresponding half width and third width bays provided within the rack of FIG. 3, according to one or more embodiments;

DETAILED DESCRIPTION

Figure 1:
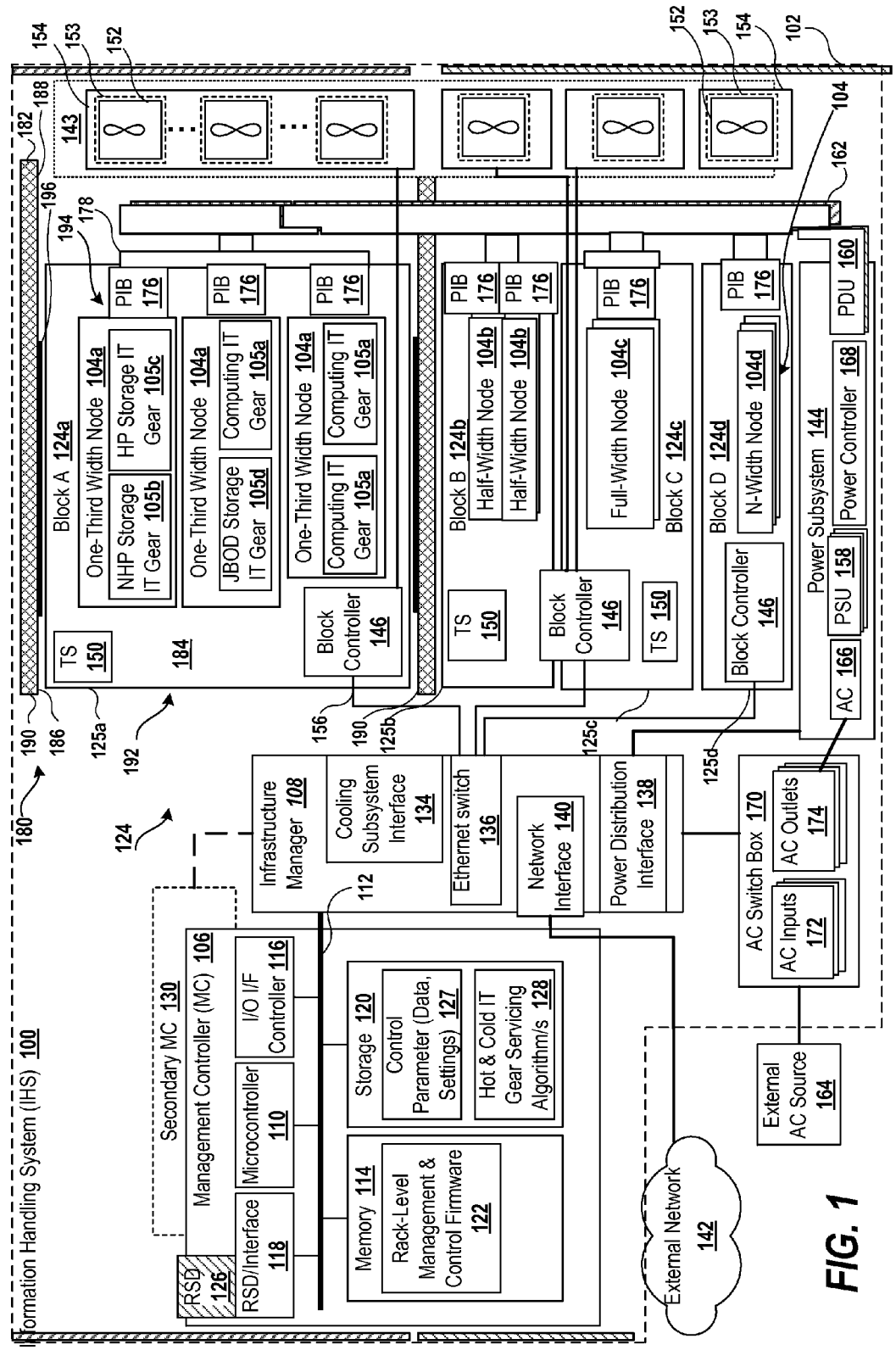
FIG. 1 is a two-dimensional block diagram illustration of an example modular, scalable, and expandable (MSE) rack-based information handling system (RIHS), presenting features of various different embodiments of the disclosure.

The illustrative embodiments provide various aspects of a rack design and corresponding rack-based information handling system that are modular, scalable, and expandable. Specifically, according to one aspect, disclosure are a modular, scalable and expandable (MSE) rack-based information handling system (RIHS) and a rack assembly for an MSE RIHS that includes: a rack assembly having a frame that defines: a front bay chassis with height, depth and width dimensions that enable insertion of a plurality of different sizes of IT gear; and a rear bay that accommodates power and cooling components to support operation of the different sizes of IT gear. The power and cooling for the IT gear are provided from the rear bay and are separate from and independent of the IT gear installed within the front bay chassis. The rack assembly further includes a power and management chassis in which is inserted a power and management module having power and management components located thereon to provide rack-level power and management. A modular configuration of fan modules are inserted within fan receptacles within the rear bay to provide block level cooling of adjacent blocks of IT gear.

Various different aspects of the modularity, scalability, and expandability of the rack and/or the rack-based IHS (RIHS) are presented in different sections of the description which follow. In order to allow for a clearer understanding of the different aspects, details of several of these aspects are presented in separate sections of the description. It is appreciated that the description of one figure can overlap with the description of another figure showing similar features or a different aspect of the same feature. Thus, descriptions of the figures are presented generally in sequentially order, but with occasional references to earlier or later figures, where appropriate. It is appreciated that because the MSE RIHS is a single unitary assembly of components, the description presented in any one section can/may overlap or be applicable to any of the other sections, without limitation. Also, the disclosure provides brief descriptions of a plurality of additional aspects, such as, but not limited to, implementation of rack-level control and management of certain power, cooling, and communication functions of the overall RIHS, and use of sensors and supporting firmware to enable data collection of ambient conditions during shipment or other physical displacement of the RIHS, among other features. These additional aspects are presented generally at the end of the description as additional functionality provided by the MSE RIHS.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Further, those of ordinary skill in the art will appreciate that the hardware components and basic configuration depicted in the various figures (e.g., FIG. 1) and described herein may vary. For example, the illustrative components within IHS 100 (FIG. 1) are not intended to be exhaustive, but rather are representative to highlight components that can be utilized to implement various aspects of the present disclosure. For example, other devices/components/modules may be used in addition to or in place of the hardware and software modules depicted. The depicted examples do not convey or imply any architectural or other limitations with respect to the presently described embodiments and/or the general disclosure.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, there is illustrated a two-dimensional block diagram of an example rack-based IHS 100 configured within a modular, expandable rack with modular configuration of various functional components inserted therein. As a two-dimensional image, certain of the presented components are shown in different orientations relative to each other for simplicity in describing the connectively of the components. For example, while certain components are shown separate from the power subsystem, in actual implementation, these components can be located on or within a power bay housing several of the components of the power subsystem. Similarly, while the power subsystem is shown with specific components within a single block, these components are not necessarily contained in a unitary structure. For example, the bus bar can be modularly extended along the entire vertical run of the rack with only one subsection in direct connection with or located within or proximate to the actual power bay. For purposes of the disclosure, all general references to an information handling system shall refer to the MSE RIHS 100, while references to actual processing nodes within the IHS 100 are understood to refer to chassis-level processing nodes or other IT gear that can be located on physical sleds within the various blocks defined within the rack. It is further appreciated that within the MSE RIHS 100 can be multiple, separate domains or computing systems that operate independent of each other and can be assigned to different independent customers and/or users. Even when configured as separate computing systems, however, the RIHS provides rack-level power management and control of these systems as a unitary IHS. The level of detail of the actual use of the processing nodes within the general rack-level RIHS 100 is not relevant to the descriptions provided herein and are specifically omitted.

As presented in FIG. 1, IHS 100 includes a rack 102, which can comprise one or more panels of sheet metal or other material interconnected to form a three dimensional volume generally referred to in the industry as a rack. Unique aspects of the rack 102, which add to the modularity and expandability of IHS 100, are further illustrated and described in one or more of the other figures presented herein. As is further presented by these additional figures, certain components indicated herein are located internal to the front section of the rack 102 while other components can be located at the back section of the rack 102. Additionally, certain of the power components and the management components are located within a module spanning both the front and back section of the rack 102. These various components are communicatively connected to one or more components via power and communication cables, which are generally represented by the connecting lines of FIG. 1.

IHS 100 comprises a hierarchical arrangement of multiple management modules, along with power and cooling components, and functional processing components or IT gear within end nodes 104. In particular, the IHS 100 provides physical and functional support for nodes 104 of one or more fractional widths including one-third width nodes 104*a*, half-width nodes 104*b*, full-width nodes 104*c*, and N-width nodes 104*d*. "N" is an integer representing the number of nodes 104*d* in a row of a server rack. "N" may also be used in reference to a fractional portion of a server rack, specifically the ratio 1/N. IT gear 105 contained by the nodes 104 can include for example, computing IT gear 105*a*, non-hot plug (NHP) storage IT gear 105*b*, hot plug (HP) storage IT gear 105*c*, and JBOD storage IT gear 105*d* containing hard disk drives (HDDs) configured as Just A Bunch Of Disks (JBOD). For example, one-third width nodes 104*a* may provide highly dense compute workloads. Half-width nodes 104*b* may provide a balance for compute and storage workloads. Full-width nodes 104*c* may be used for dense storage workloads and JBODs.

At the rack level, IHS 100 includes a management controller (MC) 106 communicatively connected to infrastructure manager/module (IM) 108. MC 106 can also be referred to as a Rack Management Controller (RMC). MC 106 includes a microcontroller 110 (also generally referred to as a processor) which is coupled via an internal bus 112 to memory 114, I/O interface controller 116, removable storage device (RSD) interface 118 and storage 120. Memory 114 can be flash or other form of memory. Illustrated within memory 114 is rack-level power management and control (RPMC or PMC) firmware 122, which is inclusive of the firmware that controls the operation of MC 106 in communicating with and managing the down-stream components (i.e., processing blocks 124 and end nodes 104, etc.) of IHS 100. IHS 100 may have blocks 124 having a block chassis 125 that provides physical support for one or more widths of nodes 104. For example, a block chassis 125*a* of block A 124*a* may receive inserted one-third width nodes 104*a*. A block chassis 125*b* of block B 124*b* may receive inserted half-width nodes 104*b*. A block chassis 125*c* of block C 124*c* may receive inserted full-width nodes 104*c*. A block chassis 125*d* of block D 124*d* may receive N-width nodes 104*d*. Each of the block chasses 125*a-d* are laterally sized for the full width of the rack assembly 102.

I/O interface controller 116 provides connection points and hardware and firmware components that allow for user interfacing with the MC 106 via one or more connected I/O devices, such as a keyboard, a mouse, and a monitor. I/O interface controller 116 enables a user to enter commands via, for example, a command line interface (CLI), and to view status information of IHS 100. I/O interface controller 116 also enables the setting of operating parameters for IHS 100, among other supported user inputs.

Removable storage device (RSD) interface 118 enables insertion or connection of a RSD 126, such as a storage device (SD) card containing pre-programmable operating firmware for IHS 100. In at least one embodiment, a RSD 126 stores a copy of the operating parameters of IHS 100 and the RSD 126 can be utilized to reboot the IHS 100 to its operating state following a system failure or maintenance shutdown. Thus, in one embodiment, removable storage device 126 is utilized to store a copy of management and/or server configuration information or firmware. The MC 106 mirrors all the critical information of the rack-level management system into both the local flash storage and on the RDS 126. For example, the information that is mirrored can include MAC addresses, IP addresses, Hostname, Gateway, user accounts, and the like. If or when a rack-level console fails, the SD card 126 is removed. A new console is provided and the RSD 126 inserted into the RSD interface 118 of the new console. At boot, the new console detects the management system information on the RSD 126 and applies all the changes automatically. According to one alternate or additional implementation, the mirroring of the management system information is also provided with an external server to allow for recovery of the system when the RSD 126 is defective or has been removed or temporarily removed so as to now necessarily contain the most updated version of the management system information. Implementation of this mirroring of management system information reduces or minimizes the downtime of establishing a new console for the RIHS 100.

Storage 120 can be any form of persistent storage and can include different types of data and operating parameters (settings) 127 utilized for functional operation of IHS 100. Among the stored content within storage 120 may also be algorithms 128 for hot and cold IT gear servicing. These algorithms control the cooling (via fans), power allocation, and other control functions of the RIHS 100. For example, the algorithms 128 can facilitate hot servicing or cold servicing of blocks 124, individually labeled as blocks A-D 124*a*-124*d*, or nodes 104. In one or more embodiments, IHS 100 can optionally include at least one other MC, illustrated as secondary MC 130, to provide a redundant configuration of MCs 106/130 which are both simultaneously active and functioning. With these embodiments, the redundant configuration enables IHS 100 to continue operating following a failure of either of the MCs 106/130 or in the event one of the MCs 106/130 has to be taken offline for maintenance.

According to one aspect, the two MCs 106, 130 can be run in a scalable active-active approach, involving minimal synchronization between the redundant MCs, which minimizes the likelihood of defects in the management controller software that can cause otherwise redundant interfaces to fail. The active-active redundant solution minimizes the number of single points of failure in software caused by complex synchronization software, while at the same time providing redundant network interfaces into the customer network. This configuration provides increased availability over typical redundant solutions service processor implementations which often only improve availability caused by hardware faults. Specifically, according to one embodiment, RIHS 100 includes multiple redundant domain-level management controllers that operate independent and asynchronously from each other and are each configured with independent configuration and firmware stores. Either management controller can simultaneously and independently read status and inventory information from the managed hardware in the rack or domain. Also, either management controller can also execute management "actions" such as node power-on, power-off independently. Finally, each management controller has an independent network and serial interface that can connect into the user's network, with independent IP addresses. This independent configuration thus provides a redundant path from the users to the management controller complex.

Infrastructure manager (IM) 108 includes cooling subsystem interface 134, Ethernet switch 136, power distribution interface 138 and network interface 140. Network interface 140 enables IHS 100 and specifically the components within IHS 100 to connect to communicate with or via an external network 142.

In addition to the above described MC 106 and IM 108, IHS 100 further comprises a fan and cooling subsystem 134, power subsystem 144, and the plurality of processing blocks A-D 124*a*-124*d*. In one implementation, each processing block 124 has an associated block controller (BC) 146. Each block 124 may be enclosed within a block chassis 125 that is inserted to the rack assembly 102 with connectors and conductors aligned for automatic engagement. For example, each block 124 may serve a basic physical building unit with the rack assembly 102, consuming 4 U of vertical space with four horizontal rows of sleds in each block 124 at 1 U per row. As utilized herein, a rack unit, U or RU is a unit of measure that describes the height of equipment designed to mount in a 19-inch rack or a 23-inch rack. The 19-inch (482.6 mm) or 23-inch (584.2 mm) dimension refers to the width of the equipment mounting frame in the rack including the frame. The width of the equipment that can be mounted inside the rack is less that the width of the mounting frame, but different widths are supported, as one aspect of the disclosure described herein. One rack unit is 1.75 inches (44.45 mm) high. A 19-inch rack is a standardized frame or enclosure for mounting multiple equipment modules. Each module (e.g., IT sled) has a front panel that is substantially 19 inches (482.6 mm) wide, including edges or ears that protrude on each side, which allow the module to be fastened to the rack frame with screws.

Figure 8:
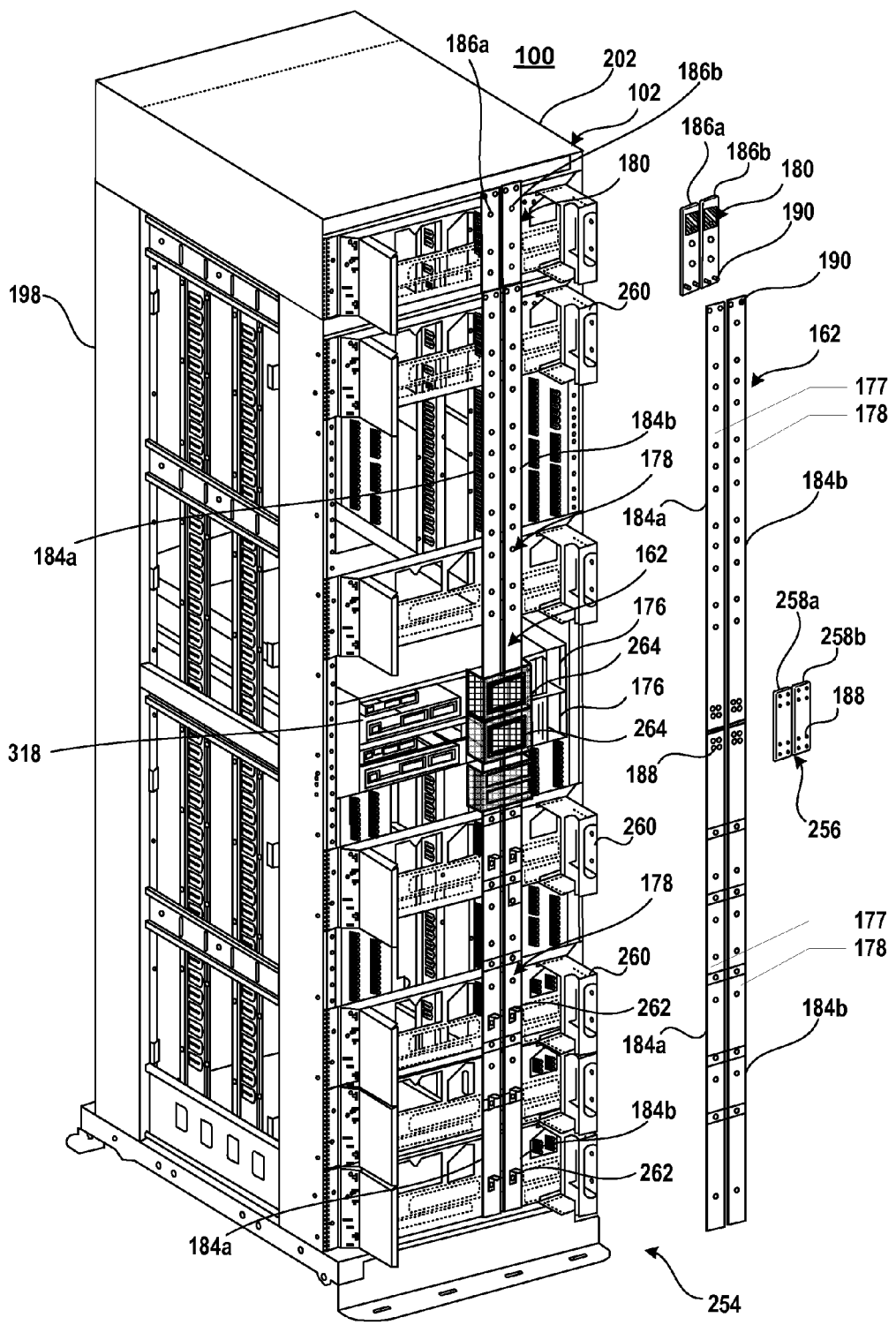
FIG. 8 illustrates a rear isometric view of the rack chassis of the MSE RISH with modular busbar components, according to one or more embodiments.
Figure 11:
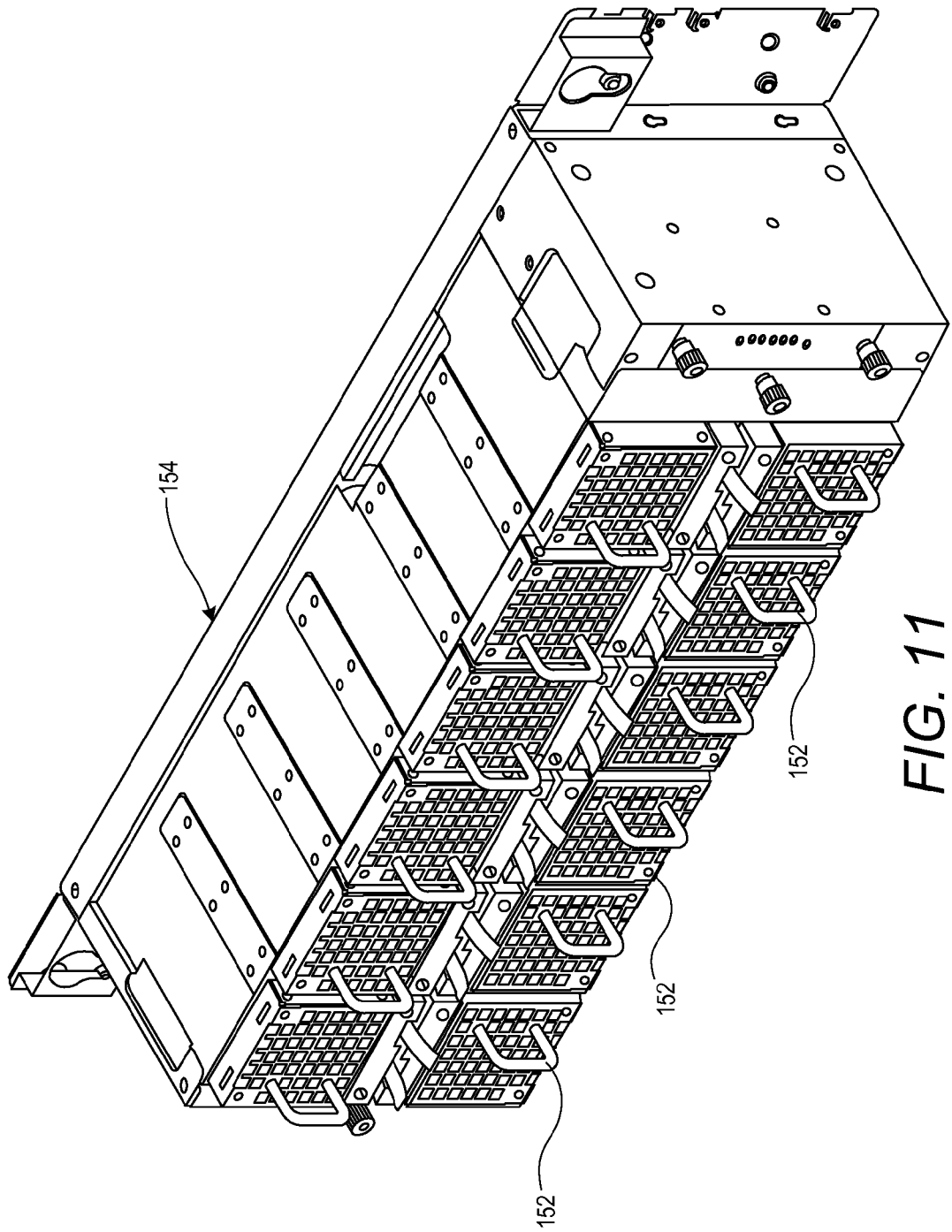
FIG. 11 illustrates a back view of a fan bay module for insertion within the rear of the rack chassis, according to one embodiment.
Figure 12:
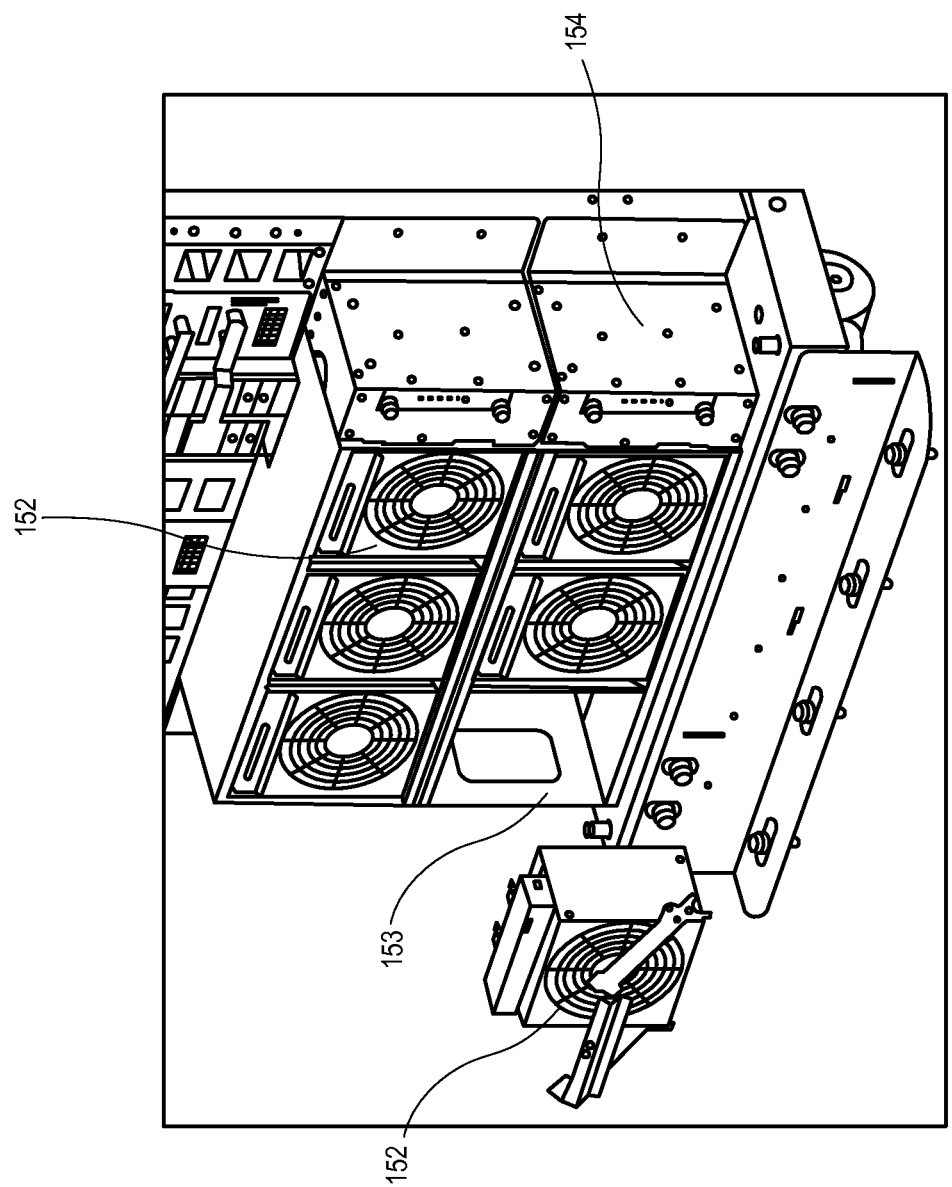
FIG. 12 provides a front view of the fan bay module with inserted modular fans, according to one embodiment.

As further illustrated by FIGS. 8, 11, and 12, described hereafter, cooling subsystem 143 includes a plurality of fan modules 152, or merely "fans", located in fan receptacles 153 within a respective fan bay module 154 and can be different sizes and provide different numbers of fan modules 152 per fan bay module 154. Also included within cooling subsystem 143 is a plurality of temperature sensors 150, which are further shown distributed within or associated with specific blocks 124. Each fan bay module 154 is located behind (or in the air flow path of) a specific block 124 and the fan modules 152 are communicatively coupled to and controlled by the block controller 146 associated with that block 124. Within each block 124 is at least one, and likely a plurality, of functional/processing nodes 106 having one or more IT gear 104. A single block controller 146 can be assigned to control multiple blocks 124b-124c, when the number of computing nodes (IT gear) 104 within an individual block does not exceed the pre-established block controller (BC) threshold. Each end node 104 controlled by a respective block controller 146 is communicatively coupled to block controller 146 via one or more cables (not shown). Ethernet switch 136 enables MC 106 to communicate with block controllers 146 via a network of Ethernet cables 156.

Figure 5:
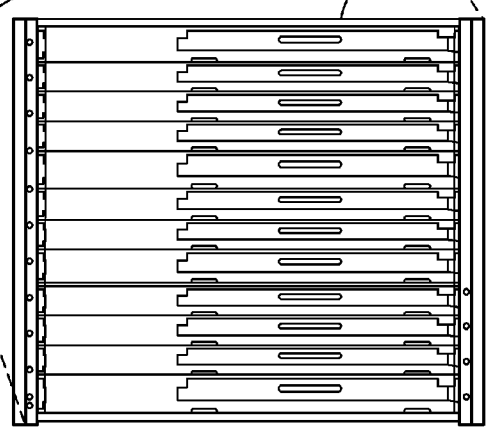
FIGS. 5-7 illustrate examples of blocks within the MSE RISH of FIG. 4 made up of full-width IT gear, half-width IT gear and one-third-width IT gear, respectively, according to different embodiments.

Power subsystem 144, which is illustrated in greater detail with FIG. 5, generally includes a plurality of power supply units (PSUs) 158, one or more power distribution units (PDUs) 160, and a modular vertical busbar assembly 162. Power subsystem 144 also includes a source of external AC source 164 connected to an internal AC power supply 166 via an AC switch box 170. Each of the individual computing nodes 104 and other components within the IHS 100 that require power are either directly coupled to modular vertical busbar assembly 162 or coupled via power cables to PDUs 160 to obtain power. As one aspect of power distribution within IHS 100, MC 106 can monitor power consumption across the IHS 100 as well as the amount of available power provided by the functional PSUs 158 and trigger changes in power consumption at the block level and ultimately at the (processing) node level based on changes in the amount of available power and other factors. Control of the power subsystem 144 can, in one embodiment, be provided by a separate power controller 168, separate from MC 106. As further illustrated, one additional aspect of the power subsystem 144 for the IHS 100 is the inclusion of AC switch box 170. AC switch box 170 is communicatively coupled to both IM 108 and power subsystem 144. AC switch box 170 includes a plurality of AC inputs 172 and a plurality of AC outlets 174 that are utilized to supply power to the PSUs 158, and other functional components of the IHS 100.

The modular vertical busbar assembly 162, which is more clearly depicted in FIG. 8, distributes DC power for the rack assembly 102 to each vertical set of nodes 104 of a respective block 124 via a power interface board (PIB) 176. PIB 176 is a narrow board that provides power and signals to four (4) nodes in a block chassis 124. One PIB 176 provides power to the four (4) full-width nodes 104c of block C 124c, two (2) PIBs 176 provide power to the eight (8) half-width nodes 104b of block B 124b, and three (3) PIBs 176 provide power to the twelve (12) one-third width nodes 104a of block A 124a. Each PIB 176 connects to one 4-node connector in the block controller 146. PIBs 176 may be electrically connected for DC power and ground to the modular vertical busbar assembly 162 by a horizontal busbar segment 1010 of each block chassis 125 (see FIG. 10).

For purposes of the disclosure all general references to an information handling system shall refer to the rack-level IHS 100, while references to actual computing nodes 104 within the IHS 100 shall be referenced as chassis level computing nodes 104 or IT components. It is further appreciated that within the rack-level IHS 100 can be implemented separate domains or systems that are independent of each other and can be assigned to different independent customers and/or users. However, this level of detail of the actual use of the computing nodes 104 within the general rack-level IHS 100 is not relevant to the descriptions provided herein and are specifically omitted. For clarity, a single rack-level IHS 100 is illustrated. However, an IHS may include multiple racks. For example, one rack may contain only storage sleds with other racks providing computing nodes. In an exemplary embodiment, components of the IHS 100 are organized into a hierarchy as described in TABLE A:

TABLE A

| Level | Device/Module | Acronym | Comments |
| --- | --- | --- | --- |
| Domain Level | Management Controller | MC | In front of Power Bay |
| Domain Level | Infrastructure module | IM | In rear of Power Bay |
| Domain Level | AC Switch Box | ACSB | Behind network switches |
| Domain Level | Power Bay Power Module | PBPM | Connects to 10 supplies and two MCs. Designed by Delta |
| Domain Level | Power Bay | Power Bay | Holds PBPM, MCx2, IM, & ACSB |
| Block Level | Block Controller | BC | Hot Plug Fan Controller + Serial & Node Interface |
| Block Level | Block Controller Distribution Board (BCDB) | BCDB | Fixed in Block |
| Block Level | Power Interface Board | PIB | Columns of 4 nodes |
| Block Level | Temperature Probe Board | TPB | Ambient Temperature Sensor |
| Node Level | Node Power Distribution Board | NPDB | In each node |
| Node Level | 4 drive HDD BP | X4HDDBP | Used in 12 drive FW HP sled |
| Node Level | 2 drive HDD PB | X2HDDBP | Used for HP 2.5" in HW sled |

Further, those of ordinary skill in the art will appreciate that the hardware components and basic configuration depicted in the various figures and described herein may vary. For example, the illustrative components within IHS 100 are not intended to be exhaustive, but rather are representative to highlight components that can be utilized to implement various aspects of the present disclosure. For example, other devices/components/modules may be used in addition to or in place of the hardware and software modules depicted. The depicted examples do not convey or imply any architectural or other limitations with respect to the presently described embodiments and/or the general disclosure.

Other features and functionality of RIHS 100 will be described in greater detail hereafter with reference to one or more of the following figures, with ongoing reference to FIG. 1. As one of the primary aspects of the disclosure, RIHS 100 provides a modular, scalable and/or expandable IT rack that is configured for concurrent installation of different types and different dimensions of IT gear. The IT gear can be placed in different length IT sleds, which can in turn be placed within IT block chasses. Notably, as one further aspect, the IT gear (which can include processing nodes, storage sleds, and other functional components) can have different height, width, and depth dimensions. Specifically, the rack chassis can be configured and/or re-configured during assembly or while functioning in the field to support multiple IT gear standards, such as different GUs, SSi standard, etc.

As one additional aspect, the RIHS 100 is designed to be able to support these different dimensioned IT gears utilizing modularly-configured fans and power configurations, which provides modular, expandable and scalable power and cooling solutions. According to one aspect, the separate power and cooling subsystems are installed in the rear of the rack, while the IT gears are installed from the front of the rack. With this bifurcation of the IT gear from its power and cooling subsystems, the size (i.e., height, width, and/or depth) of the IT gear solution can change, while allowing the power and cooling for the infrastructure to remain consistent or be changed, if desired, independently of the actual IT gear being supported. With this bifurcation of the power and cooling from the actual IT gear and IT sled carrying the IT gear, the MSE RIHS 100 enables a designer or customer to mix and match the different sizes (height, width and/or length) of the IT nodes that are being utilized within the same, single rack chassis.

Figure 2:
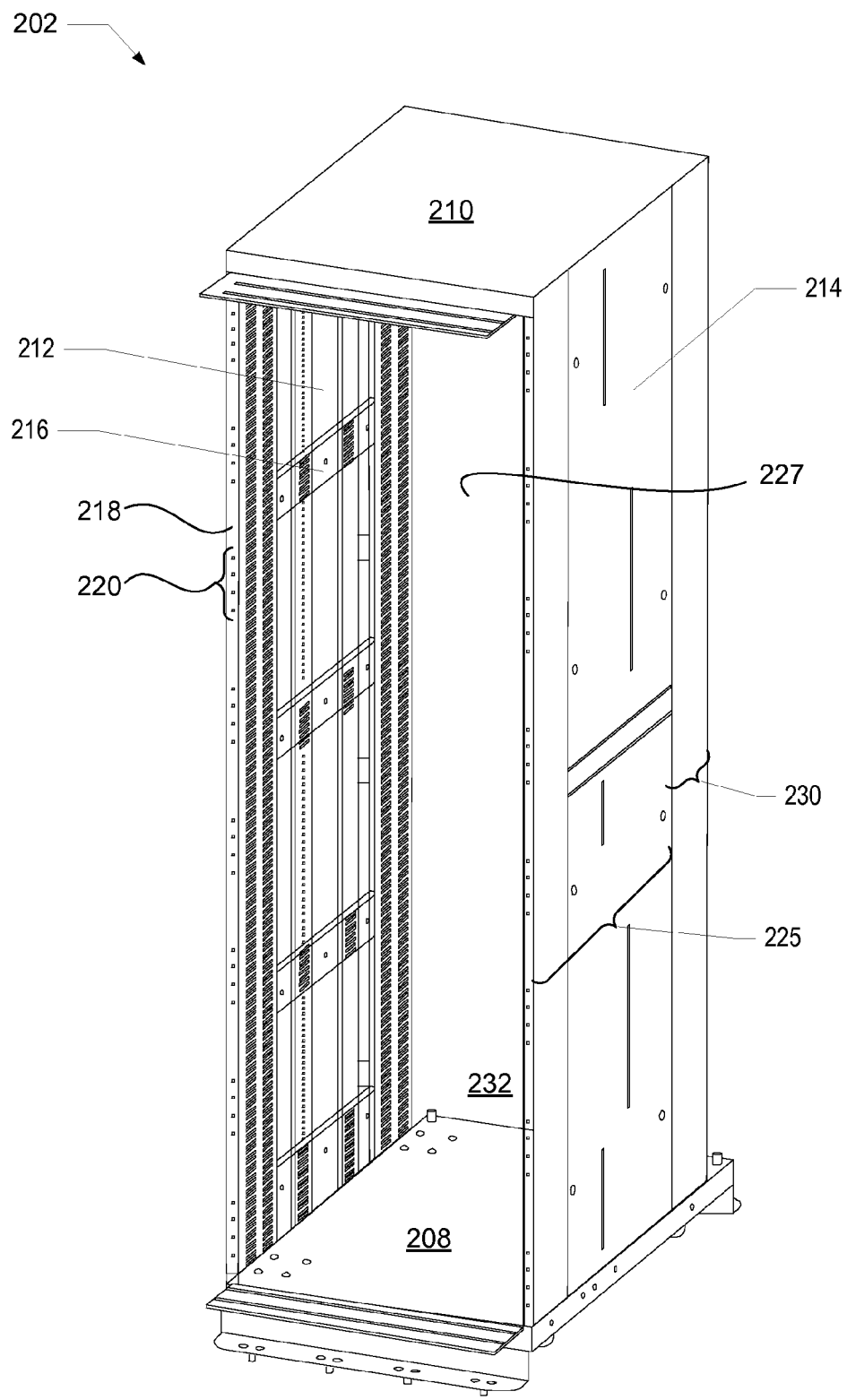
FIG. 2 illustrates a front isometric view of an example rack chassis prior to insertion of functional components for the rack to operate as an IHS, according to one or more embodiments.

Referring now to FIG. 2, there is illustrated a front isometric view of a bare-bones representation of a rack chassis 202. As shown, rack chassis 202 is made up of a base structure comprising a plurality of interconnected panels forming a volumetric space having a front section and a rear section. The interconnected panels are collectively referred to as rack casing in FIG. 1 and include opposing side panels 212, 214, a base panel 208 and a top panel 210. Opposing side panels 212, 214 of rack chassis 202 run parallel to each other from front to rear to form a front access space (or front bay) 225 and a rear access space (or rear bay) 230, respectively, between corresponding opposing side panels 212, 214. A plurality of guides 216, which run in a same direction from the front section 204 towards the rear section 206, are located within interior surfaces of the opposing side panels 212, 214 at the front section 204. Rack chassis 202 is configured to receive functional components, including IT gear, power modules and other components. These components are typically included within a corresponding sled that can be further inserted within a block chassis. Block chasses containing IT gear are physically inserted into the front bay 225 of the rack chassis 202 and held in place by at least two opposing guides 216 of the opposing side panels 212, 214, and other structural supports as required, such as screws. The block chasses have a frame that provides a block height, which enables insertion of at least one layer of up to N side-by-side fully functional IT gears 104 within the block chassis. In the illustrated embodiment, the front surface 218 of the opposing side panels 212, 214 includes attachment affordances 220, which are shown as groupings of perforations or holes. The attachment affordances 220 are utilized to provide structural support to hold one or more sleeves 450 (FIG. 4) or expansion panels (see FIGS. 13-15) that can be attached to the opposing side panels 212, 214 of rack chassis 202.

Figure 4:
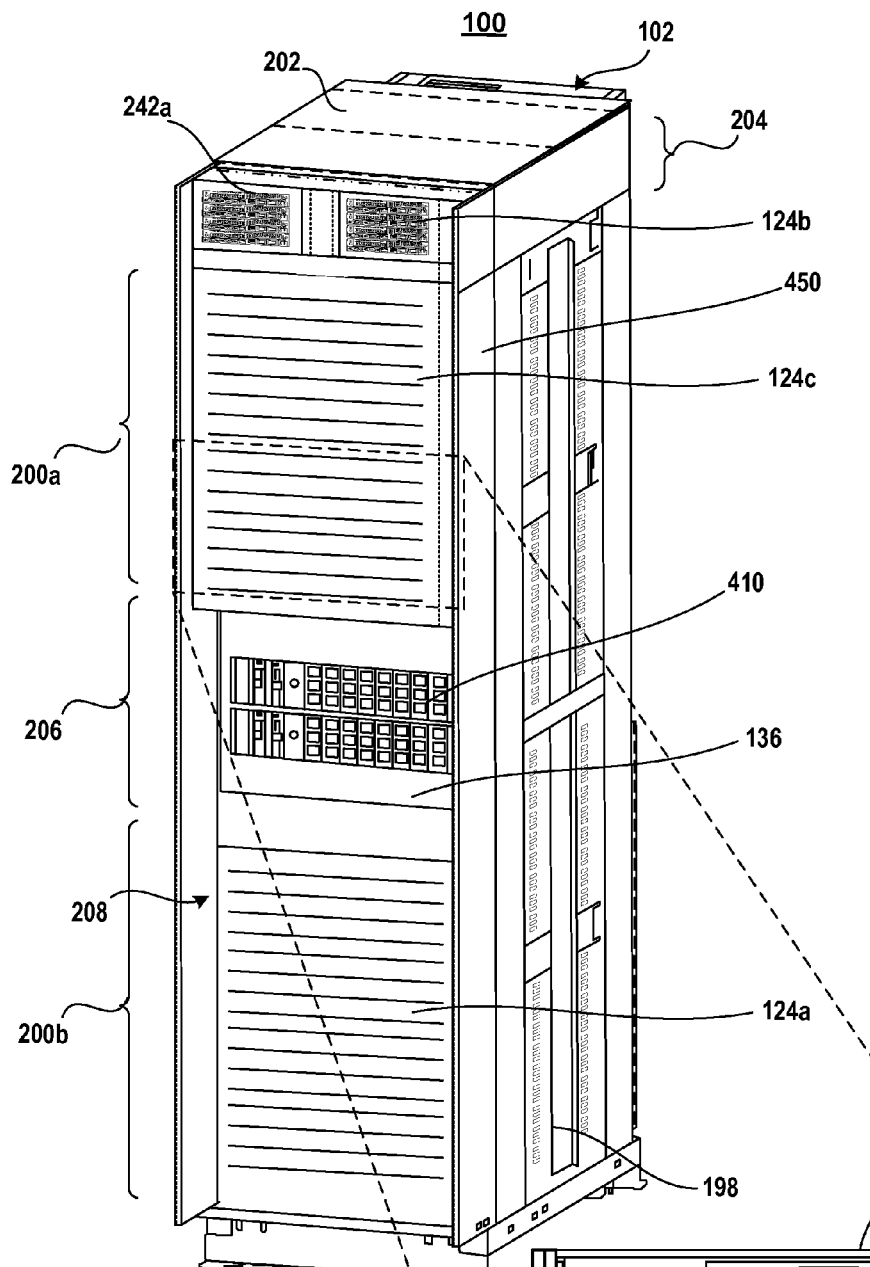
FIG. 4 illustrates a front isometric view of the MSE RISH with inserted IT gear, including different width IT nodes, according to one embodiment.

FIGS. 3 and 4, respectively, provide a front isometric view of block-segmented rack chassis 202 and fully assembled RIHS 100, according to one or more embodiments. Specifically, FIG. 3 depicts vertical delineations of functional components and the block chasses within the rack chassis 202 to accommodate specific sizes of IT gear, according to one or more embodiments. FIG. 4 and FIGS. 5-7 then illustrate aspects of a fully assembled front section of the RIHS 100 and the different sizes and numbers of IT gear 105 that can simultaneously be inserted within the block chasses.

Referring to FIG. 3, rack assembly 300 includes an upper standard zone 304a and a lower standard zone 304b on either side of a power and switch zone 306. The power and switch zone 306 of the rack assembly 300 includes a switch bay 316 (2 U), two power bays 318 (3 GU×2), and another switch bay 316 (2 U). These bays 316, 318 can respectively receive power and management module/s (PMM) 410 and switches 136 (FIG. 4), which extend from the front of the rack chassis through to the back of the rack chassis, occupying both the front bay and rear bay at that section of the rack chassis. A switch or switch module 136 (FIG. 1) is inserted into and received by each of switch bays 316. Switch 136 provides switch communication functions to IHS 100.

According to one embodiment, the rack assembly 300 includes a plurality of different bays located within the front access space and forming one or more information technology (IT) bays; and one or more block chasses slidably located within respective ones of the plurality of bays, the one or more block chasses including a plurality of functional components that enables the rack assembly to function as one or more IHSes. One aspect of the disclosure involves the paralleling of power bays as AC/DC power backup. The power bay is configured to accept both AC and DC input PSUs 158. The PSUs 158 incorporate input voltage type identification function. When the two power bays are connected together, one is automatically set to be the main power bay and the other is relegated to be the back-up power bay. The designated backup power bay will then be turned off during normal operation. The backup power bay is then turned on only when receiving the input power loss or failure signal from the main power bay. Once the relevant signal is received, the backup power bay can immediately switch on and maintain the output power levels being provided to the consuming components by the main power bay. Also, when the main power bay comes back online (i.e., no longer registers or transmits a failure signal), the backup power bay will turn itself off or be turned off by the controlling firmware of the main power bay power, which has resumed providing power to the RIHS 100. It is appreciated that a similar method can be extended to provide backup between two other power sources, such as two AC sources and/or one AC or DC source and a battery or alternative energy source.

The rack assembly may also include a second frame assembly 308 attached on top of the first frame assembly 302 to provide an expansion zone 310 for the rack assembly. The upper standard zone 304a of the first frame assembly 302 may be configured as a 20 GU server zone divided horizontally into four tiers by shelves 312. Each shelf 312 may provide full-width IT bays 314 or include partitions for partial-width bays. The lower standard zone 304b may be configured as a 25 GU server zone divided into tiers by shelves 312 into full-width IT bays 314. Lower standard zone 304b has received a block chassis 125a partitioned to receive one-third width nodes (IT gear) 104a (FIG. 3-2). In the illustrative configuration, the second frame assembly 308 has received a block chassis 125a partitioned to receive one-half width nodes (IT gear) 104b (FIG. 3-1). As shown by FIGS. 3-1 and 3-2, half width node 104b and a third-width node 104a arranged within corresponding IT sleds 360, 370 have different width dimensions 364, 374 respectively, that are fractional parts of a full-width of the front bay 225 or block chassis inserted therein. Half-width node 104b and a third-width node 104a can have different length (or depth) dimensions 362, 372 respectively, and can also have different height dimensions (as a multiple of the base unit of height supported for IT gear). The represented IT gear is constructed on IT sleds that can be slidably inserted into the corresponding half-width and third-width IT bays 125b, 125a. In at least one embodiment, the IT gear within the corresponding IT sleds 360, 370 can be server nodes or storage device nodes, and the features of the present disclosure are fully applicable regardless of the configuration of the sleds that are inserted within the rack chassis 202.

The above descriptions of the physical and/or structural components of the RIHS 100 and/or rack chassis 202 collectively provide a modular, scalable/expandable (MSE) rack assembly for physically supporting components of one or more IT gear, such as processing or server nodes, storage devices, and the like which are inserted into the rack chassis 202 via respective IT sleds. As illustrated by FIGS. 2-4, with ongoing reference to FIG. 1, a rack assembly includes: an external rack chassis 202 made up of sheet metal or some other structural material that maintains a rigid shape when assembled. The rack assembly further includes: a rack chassis comprising a plurality of interconnected panels forming a volumetric space having a front section and a rear section, both with opposing side panels forming a front access space and a rear access space, respectively, between corresponding opposing side panels; and a plurality of guides located within interior surfaces of the opposing side panels at the front section, the plurality of guides running in a lateral direction along the front access space towards the rear section. The rack assembly also includes one or more block chasses each having a frame that provides a block height, which enables insertion of at least one layer of N fully functional IT gears within the block chassis, the frame defining a corresponding information technology (IT) bay, having a total width that enables attachment to opposing guides on the opposing side panels and configured to support insertion of one or more IT gears having at least a first size dimension selectable from among multiple supported height, width, and depth dimensions ranging from a fractional or partial width, height and depth dimension to a full height, full width, and full depth dimension of IT gear insertable into the particular block chassis. The block chassis is physically inserted into the front section of the rack chassis 202 and held in place by at least two opposing guides on the opposing side panels.

Figure 6:
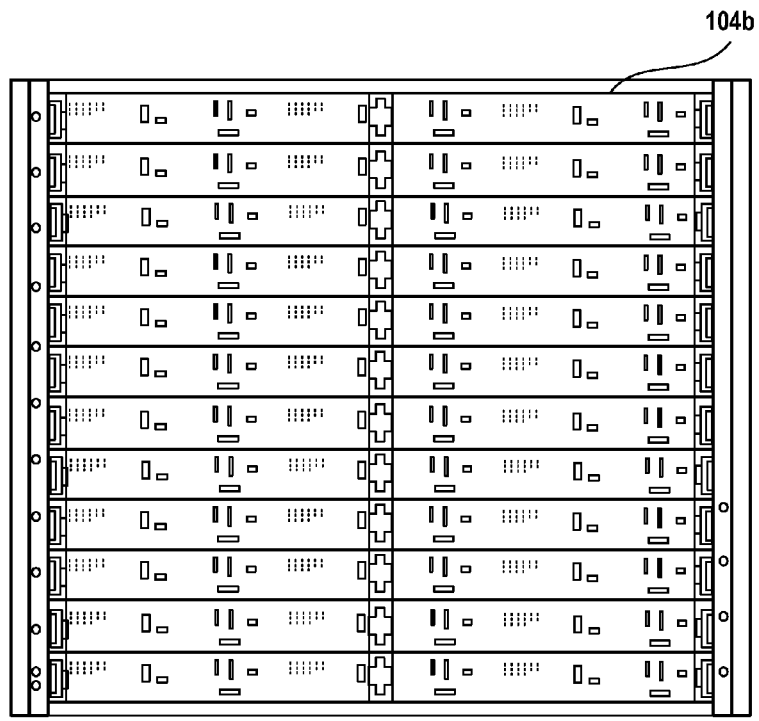
Figure 7:
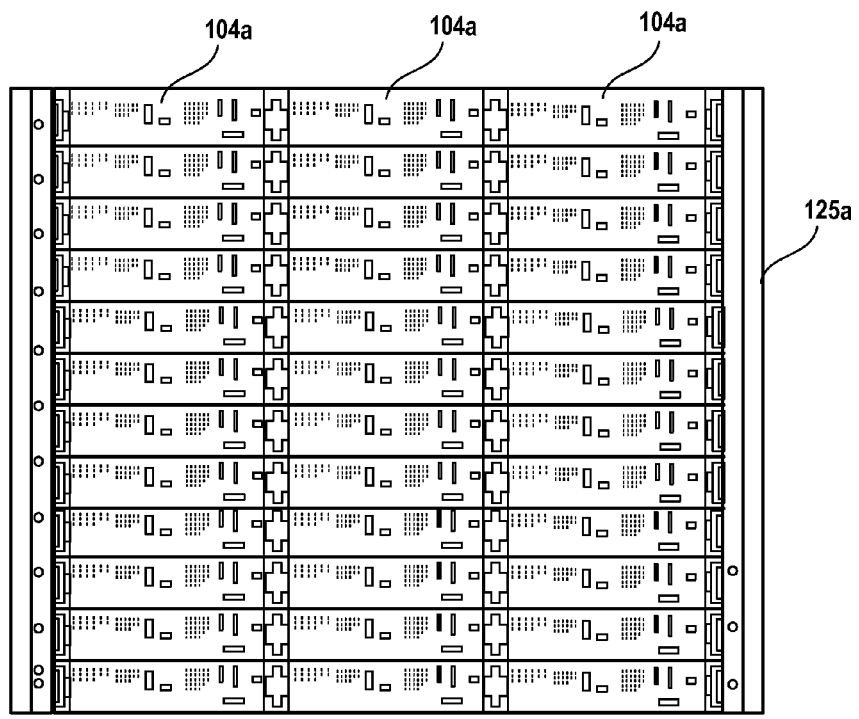

Referring now to FIG. 4 and associated figures, FIGS. 5-7, there are provided specific examples of a full block of N side-by-side IT gear or nodes inserted within fully assembled MSE RISH 100. With the various examples, the number, N, of side-by-side IT gear supported within a particular block is an integer from among 1, 2, and 3, although larger integers can be supported with alternate designs. As provided by these figures, when N is equal to 1, the rack assembly 102 includes at least one block chassis 125c that includes full width IT sleds having singular IT gear embedded thereon (FIG. 5). When N is equal to 2, the modular, expandable rack assembly 102 includes at least one block chassis 125b having one or more rows of two (2) side-by-side fully functional IT gears 105, located on half-width sleds to create half-width nodes 104a-b, inserted therein (FIG. 6). The two side-by-side fully functional IT gears 105 comprise two one-half width IT gear that are one half a size of a standard width IT gear. In an alternate embodiment, a full width sled is utilized to co-located two half-width IT gear on a single sled. With this alternate configuration, a middle separating bracket is not required within the rack chassis 202. When N is equal to 3, the modular, expandable rack assembly 102 has at least one block chassis 125a having one or more rows of fully functional IT gears 105a-d in three (3) side-by-side one-third width nodes 104a, located in corresponding one-third width sleds, inserted therein. The fully functional IT gears 105a-d within the three side-by-side in one-third width nodes 104a are one third a size of a standard width IT gear. In one alternate embodiment, a full-width sled is partitioned to accommodate the three one-third width IT gear thereon.

Referring to a combination of features presented in FIGS. 1, 2, 3, 4 and 7, given the capability and/or functionality of supporting different width IT gear, opposing sidewalls 212, 214 of the rack assembly 102 are spaced to receive a block chassis 125 (FIG. 1), such as block A chassis 125a. Block A chassis 125a is capable of housing IT components as a block A node 124a that is inserted from an open front side 222 of the rack assembly 102. In one illustrative example, block A chassis 125a has one or more rows for insertion of three (3) side-by-side one-third width IT sleds 370 (FIGS. 3 and 7) that are inserted in at least one of the one or more rows, and each contain IT gear 105. In one embodiment, guides 324 (FIG. 3) are provided inside of the block A chassis 125a for supporting insertion of the individual one-third width IT sleds (104a). The guides 324 present a thin lateral thickness of a panel so that the lateral width of a row of three one-third IT sleds (370) substantially defines the width of the block A chassis 125a. The one-third width IT sleds 370 include a base panel (see 370) that hold the IT gear 104 (e.g., a motherboard with interconnected functional components) between opposing side panels. The specific configuration of the IT sleds can vary so long as they provide the appropriate dimensions for insertion into the relevant block chassis.

Thus as shown, the block chasses can be individually configured to enable insertion of a select one of multiple different widths of IT gear ranging from a full width IT gear to a fractional (1/N) width IT gear, where N is an integer greater than 1. Also, according to one aspect, the block chasses of the MSE RIHS can be configured to support a hybrid arrangement of IT gear, including at least two different widths of IT gear from among the multiple different widths of IT gear, in different sled layers within the one block chassis. With this hybrid configuration, each sled layer includes only a single-sized width IT gear (i.e., a single full width, two half-widths, or three third-widths, of four fourth-widths, and so on.).

FIG. 8 illustrates the rear isometric view 254 of the location of power bay chassis 318 in the switch zone 306 (FIG. 3) of the rack 102. FIG. 8 also illustrates a modular vertical busbar assembly 162 as installed, as well as illustrating the modular vertical busbar assembly 162 in an exploded view. Rack 102 also includes the second frame assembly 202 attached on top of the first frame assembly 198. The example rack-based IHS 100 includes upper and lower power bay chasses 318 with each having corresponding first vertical busbar segment 178. In the illustrative configuration, the upper first vertical busbar segment 178 extends upwardly from the upper power bay chassis 318 and the lower first vertical busbar segment 178 extends downwardly from the lower power bay chassis 318.

The upper and lower first vertical busbar segment 178 further include respectively a first positive vertical busbar conductor 184a and a first negative vertical busbar conductor 184b. A middle vertical busbar segment 256 includes a positive middle conductor 258a and a negative middle conductor 258b that tie the upper and lower vertical busbar segments 178 together. The upper vertical busbar segment 178 is connected to the second vertical busbar segment 180 and includes a second positive vertical busbar conductor 186a and a second negative busbar conductor 186b. The electrical attachment between the power bay chassis 318 and the upper and lower vertical busbar segments 178 are covered by a shield or faraday cage 264, which is mounted to the back side of chassis 202 around busbar segments 256, 178. Shield 264 prevents accidental shorts by stopping external objects from coming into contact with power bay busbar 552, 554 and/or busbar segment 177, 178.

Figure 9:
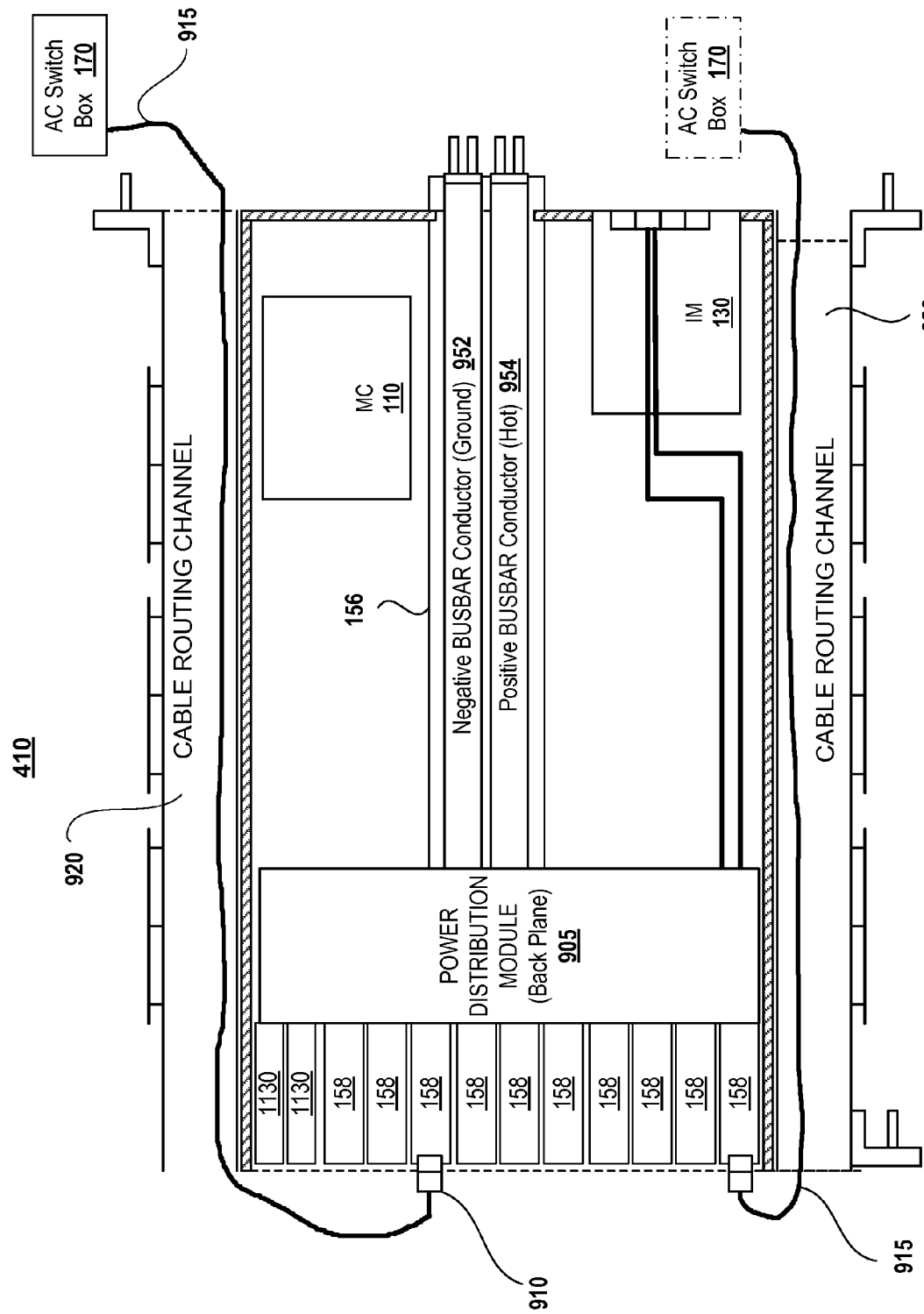
FIG. 9 provides a block diagram of one possible configuration of a power and management module (PMM) designed for providing centralized power and management functions within the MSE RISH, according to one embodiment.

Located within power bay chassis 318 is PMM 410, specific features of which are illustrated by FIG. 9. As provided by FIG. 9, PMM 410 includes a plurality of PSUs 158 connected to a power distribution module 905 that provides power to the various IT gear outside of the power bay through a segmented, modular vertical bus bar assembly 162, having negative and positive busbar conductors 162a, 162b. The power distribution module 905 electrically connects to a positive distribution conductor 954 and a negative distribution conductor 952. Aft-facing pins 190 are aligned to engage holes 188 (FIG. 8) in the middle of vertical busbar segment 256 and one of the first and second vertical busbar segments 178, 180 (FIG. 8).

Included in PMM 410 is infrastructure module (IM) 130 whose functionality has been described with reference to FIG. 1. Finally, to support and/or manage the power cables 915 utilized to supply AC power to PSUs 158, PMM 410 includes two cable routing channels 920, which extend from the front to the rear of the PMM 410 on either side of the PMM 410. Power cables 915 are run from AC switch box 170 to the PSUs 158 through cable routing channels 920. Thus with the exception of the short run of power cables 915 from the corresponding plugs 910 into the PSUs 158, the remaining run of power cables 915 are hidden from view within RIHS 100.

Figure 10:
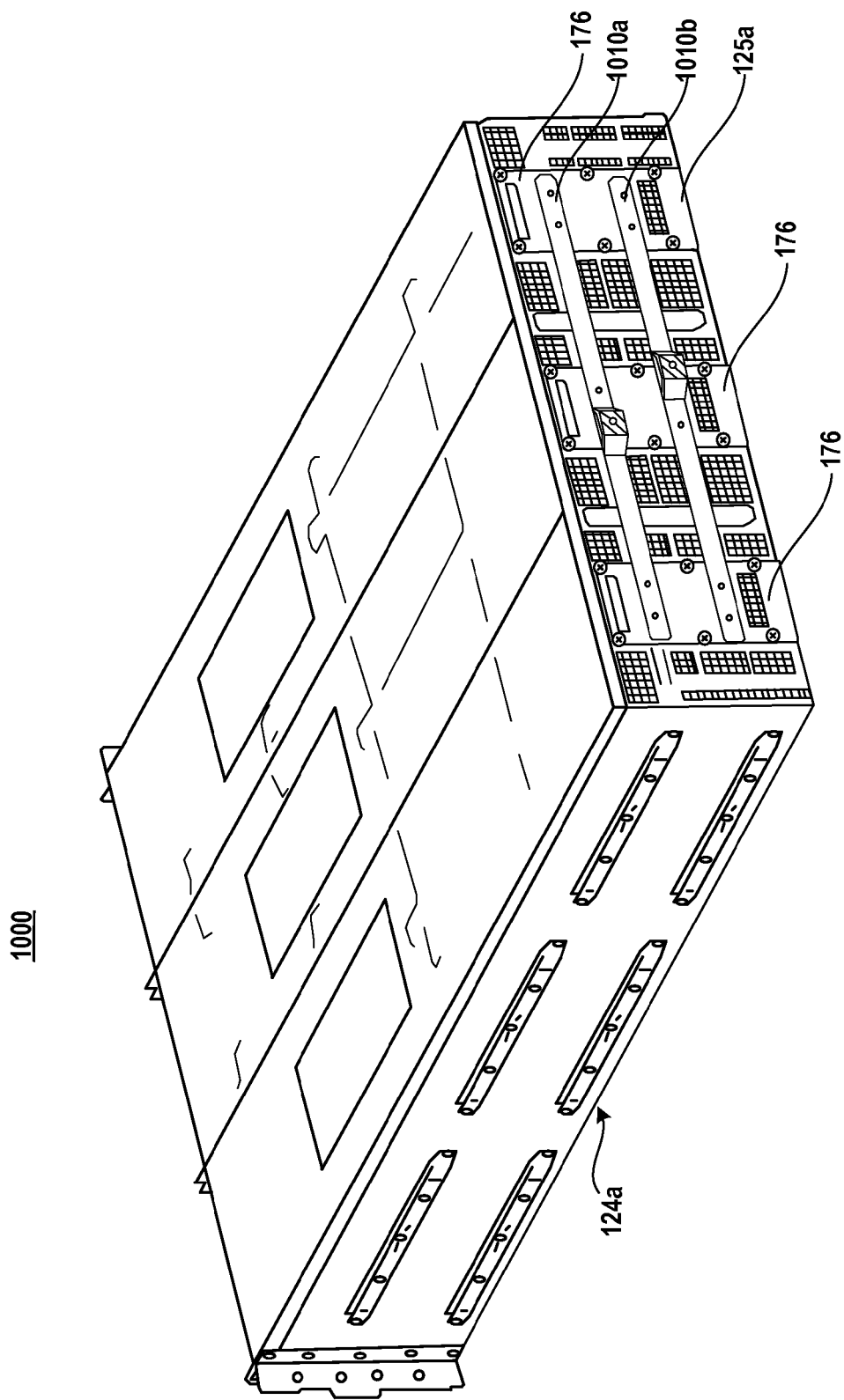
FIG. 10 illustrates a back isometric view of an example block chassis or IT gear sled configured with horizontal bus bars to support connection to the modular bus bar at the rear of the rack for hot-pluggable insertion into the rack chassis of an MCE RIHS, according to one or more embodiments.

In at least one embodiment, the majority and possibly all of the individual IT nodes and other components within IHS 100 that require DC power (or less than the full complement of AC power) are directly or indirectly coupled to modular vertical busbar assembly 162 via one or more intervening bus bar segments, which may include horizontal bus bar segments located at the back of the block chassis. FIG. 10 illustrates a rear isometric view of a block chassis 1000 or IT sled having horizontal bus bars 1010a-b (serving as power conductors) attached to a rear of the block chassis 1000 for electrically coupling to a bus bar segment 178 or 180 to provide power to the IT gear placed within the block chassis 1000 or IT sled. With the modular bus bar configuration, all IT components are slidably inserted into the front bay towards the back of the front bay where the power conductors (horizontal bus bars 1010a-b) of the IT component electrically couple to the busbar segment running along the rear of the IT sled. A hot pluggable implementation of different sized IT gear can thus be supported by utilizing a block chassis design that provides the required positive and negative conductor pairs at the specific location at the rear of the block chassis to abut the positive and negative conductors of the busbar segment. As provided by example of FIG. 10, each chassis or block is fitted with a horizontal bus bar 1010 that will be positioned close to the main vertical bus bar in the rack. According to one embodiment, each horizontal bus bar 1010 will have an electrical coupling affordance, such as a pin or sleeve assembly, that will connect the horizontal and vertical bus bars together as the chassis or block is slid into place from the front of the rack towards the back of the front bay abutting the rear bay.

As provided by the preceding figures, and particularly FIGS. 9 and 10, the MSE rack assembly also includes: a power bay located within a segment of the rack that is specifically designed to receive one or more power bay chasses; a power bay chassis inserted within the power bay; and a power and management module (PMM) 410 slidably inserted into the power bay chassis and having power distribution module 905 (FIG. 9). The PMM 410 includes a plurality of power supply units (PSUs) 158 that provide power to all functional components of the one or more IHSes. As an extension of the modularity of the RIHS 100, the MSE RIHS 100 also includes a modular vertical busbar assembly 162 electrically coupled to the power distribution module 905 of the PMM 410 and extendable in busbar segments (see FIG. 8) along at least a length of a back of the front bay within which one or block chasses having IT gear are inserted.

Referring to FIG. 1, as one additional aspect of power distribution within IHS 100, MC 106 can monitor power consumption across the IHS 100 as well as the amount of available power provided by the functional PSUs 158 and trigger changes in power consumption at the block level and ultimately at the (processing) node level, based on changes in the amount of available power and other factors. To support these rack-level management features among others, PMM 410 is configured with both MC 106 and IM 108 embedded thereon and interconnected with each other and with power controller 168. These components are then interconnected with the block controllers and other devices within RIHS 100 via communication cabling, such as Ethernets. These connections can be direct connections or connections completed via switch 136 (FIG. 1).

FIG. 8 also illustrates a plurality of fan bay receptacles 260 that are attached to the rear section of rack 102 to receive respective fan bay modules 154 (FIGS. 11 and 12). Each fan bay receptacle 260 positions an inserted fan bay module 154 into contact with pairs of rear facing conductive components 262 vertically spaced on the first and second busbar segments 178, 180. Shrouds 264 are attachable to the rear section of the rack 102 to block rear access to pairs of rear facing conductive components 262 that are not located behind fan bay modules 154. Accordingly, the MSE RIHS 100 includes: at least one fan bay attached to the rear section of the rack chassis 202, the at least one fan bay, or fan bay receptacle 260, sized to receive a fan module comprising at least one and up to a plurality of individual fan units; and at least one fan bay module 154 insertably placed within a rear cabinet, each module having at least one fan 152 inserted therein, the at least one fan 152 being a size dimension that is one of a plurality of different size dimensions supported by the particular fan module. According to one aspect, a location of each of the at least one fan bay is laterally adjacent to a location of each block chassis defined within the front section of the rack chassis 202 to enable direct cooling of specific IT gear located within the adjacent block chassis to the fan bay. Also, a configuration of the at least one fan within a fan module is one of a plurality of different fan configurations that are individually supported by the rack fan bay. In one embodiment, the rack assembly further comprises at least one fan controller that is configurable to control each of the plurality of different fan configurations and which, in response to detecting a first fan configuration of a first fan module inserted within a first fan bay receptacle, activates a corresponding first control algorithm that enables the detected first fan configuration to be utilized to provide direct cooling for one or more of the IT gear inserted within the rack adjacent to a location of the fan bay. Each cooling zone within the IT rack solution can have a different fan configuration in order to optimize the cooling and power for the IT within each zone. This cooling functionality can be applied to many different configurations and fan sizes.

With the installed fan bay modules 154 having selective sets of fan units 152 supporting one of the blocks of IT gears, RIHS 100 also provides rack-level thermal control, including thermal monitoring/sensing at the block level or individual IT node level. This rack-level implementation provides the ability to create an inlet temperature gradient across the rack to ensure that hot spots are accounted for and the fans can be adjusted properly. The above and other features thus provide a mechanical and management structure to allow for a flexible fan configuration.

The above descriptions of the physical and/or structural components of the MSE RISH, collectively provide a modular, scalable/expandable (MSE) rack assembly for physically supporting components of one or more IT gear such as processing nodes, and others within an RISH. The rack assembly includes: a base structure comprising a plurality of interconnected panels forming a volumetric space having a front section and a rear section. Both the front section and rear section have opposing side panels forming a front access space and a rear access space, respectively, between corresponding opposing side panels. A plurality of guides, which run in a same direction from the front section towards the rear section, is located within interior surfaces of the opposing side panels at the front section. The based structure is generally referred to as the rack chassis 202. The rack assembly further includes: a power bay located within a segment of the rack and within which one or more power bay chasses can be slidably inserted; and a power bus bar electrically coupled to a conducting portion of the power bay and extending along at least a length of the base structure within which one or more IT gear chasses are inserted within the front access space. Within the power bay is inserted a power bay sled having a rear conductor plate that is electrically coupled to the power bus bar when the power bay sled is fully inserted from the front access space to extend into the rear access space. The power bay sled can be slidably inserted within the power bay and the power bay sled includes a plurality of power supply units (PSUs) that provide power to all functional components of the RIHS.

As one aspect of the disclosure, the rack assembly has a modular structure that supports insertion of different numbers and sizes of information technology (IT) gear. The assembly further includes a fan bay receptacle attached to the rack and which supports insertion of multiple different fan configurations; at least one fan module inserted within the fan bay receptacle to conform to at least a first fan configuration; and a fan controller that is configurable to control each of the different fan configurations and which, in response to detecting the first fan configuration of the first fan module inserted within the fan bay receptacle, activates a corresponding first control algorithm that enables the detected first fan configuration to be utilized to provide rack-level cooling for one or more of the IT nodes inserted within the rack.

In one or more embodiments, the rack assembly includes: a rack management controller (MC) that operates to provide rack level control and management and to enable an external interfacing with the rack components; and at least one block controller, each contained in a corresponding block chassis and communicatively coupled to other functional components within the corresponding block chassis and to the management controller. The BCs support and provide all block level control for the corresponding block chassis to which the BC is associated.

According to one configuration, the rack assembly further includes an infrastructure manager (IM) contained in the power bay chassis and which controls thermal and power functions of the functional components within the racks at a rack level.

In addition to the above described functional configuration of the MSE RIHS, with power and cooling components provided within the rear bay and/or the PMM, the front section of the rack chassis is further configured with a plurality of attachments on opposing side rails of the opposing side panels which enable slidable insertion and removal of one of a single unit height IT gear and a block chassis that has greater than a single unit height. According to one aspect, the plurality of attachments are vertically spaced at one of: (a) single unit heights corresponding to a smallest height IT gear and (b) larger units of height to accommodate insertion of different heights of IT gear. Additionally or alternatively, each of the plurality of guides along each panel of the opposing side panels are separated from a closest adjacent guide by at least a first unit of height that is sufficient to accommodate insertion of a smallest standard height information technology (IT) gear chassis within the front bay. And, the guides are designed to enable insertion of at least one second height IT gear chassis that is larger than the smallest standard height, to enable the rack assembly to simultaneously accommodate multiple different heights of IT gear chasses within the front bay of the rack assembly.

According to one aspect, the height of a block chassis is substantially equal to a whole number multiple of a sled height of a smallest standard-height IT gear, and when the IT gear is a first height that is less than the block height, the block chassis supports two or more vertically adjacent layers of IT gear. Also, the MSE rack assembly comprises a single block controller that controls operations of all components within the block chassis. The MSE rack assembly can then include: at least one standard height IT gear sled slidably inserted into a first segment of the front access space between adjacent guides on opposing side panels of the front section; and at least one second height IT gear chassis slidably inserted into a second segment of the front access space between non-adjacent guides on opposing side panels of the front section.

According to one embodiment, the front bay that the IT sleds are inserted into is designed with sleeves connected to the opposing side panels. The sleeves translate forward and backwards to accommodate the longer length sleds in order to provide the proper cooling channel and EMI containment for the extended portion of the sleds. Alternatively, the sled bay is designed with uniform depth for all sleds and expansion panels or sleeves are provided for selective placement around the longer IT sleds in order to protect the exposed section of these longer IT sleds.

Figure 13:
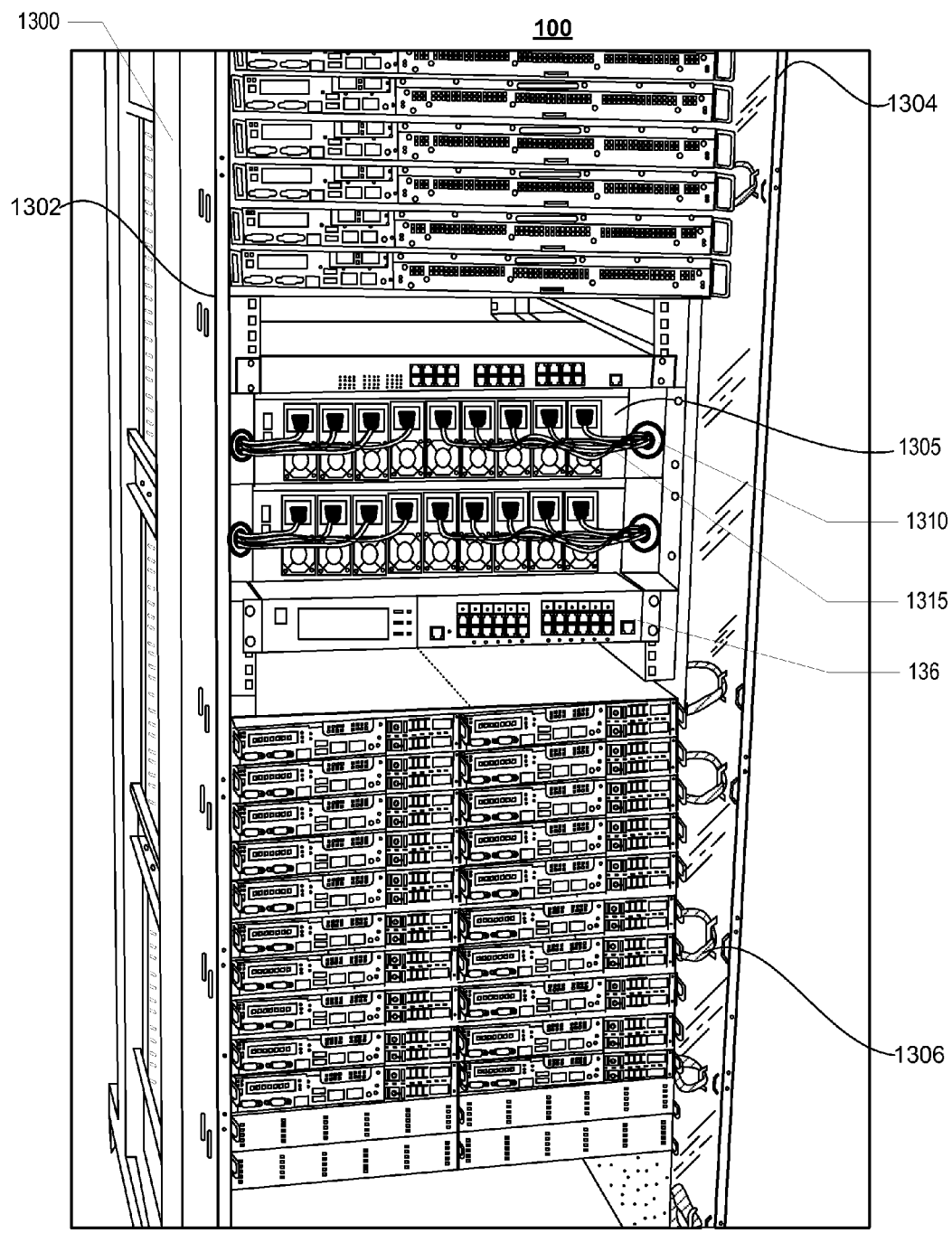
FIGS. 13 and 14 illustrate example modular cable management panels, which serves as expansion panels providing straps that are utilized to bundle and route the communication cabling extending to and/or from the IT gear/nodes along the vertical spacing of the front of the rack chassis, according to one or more embodiments.
Figure 14:
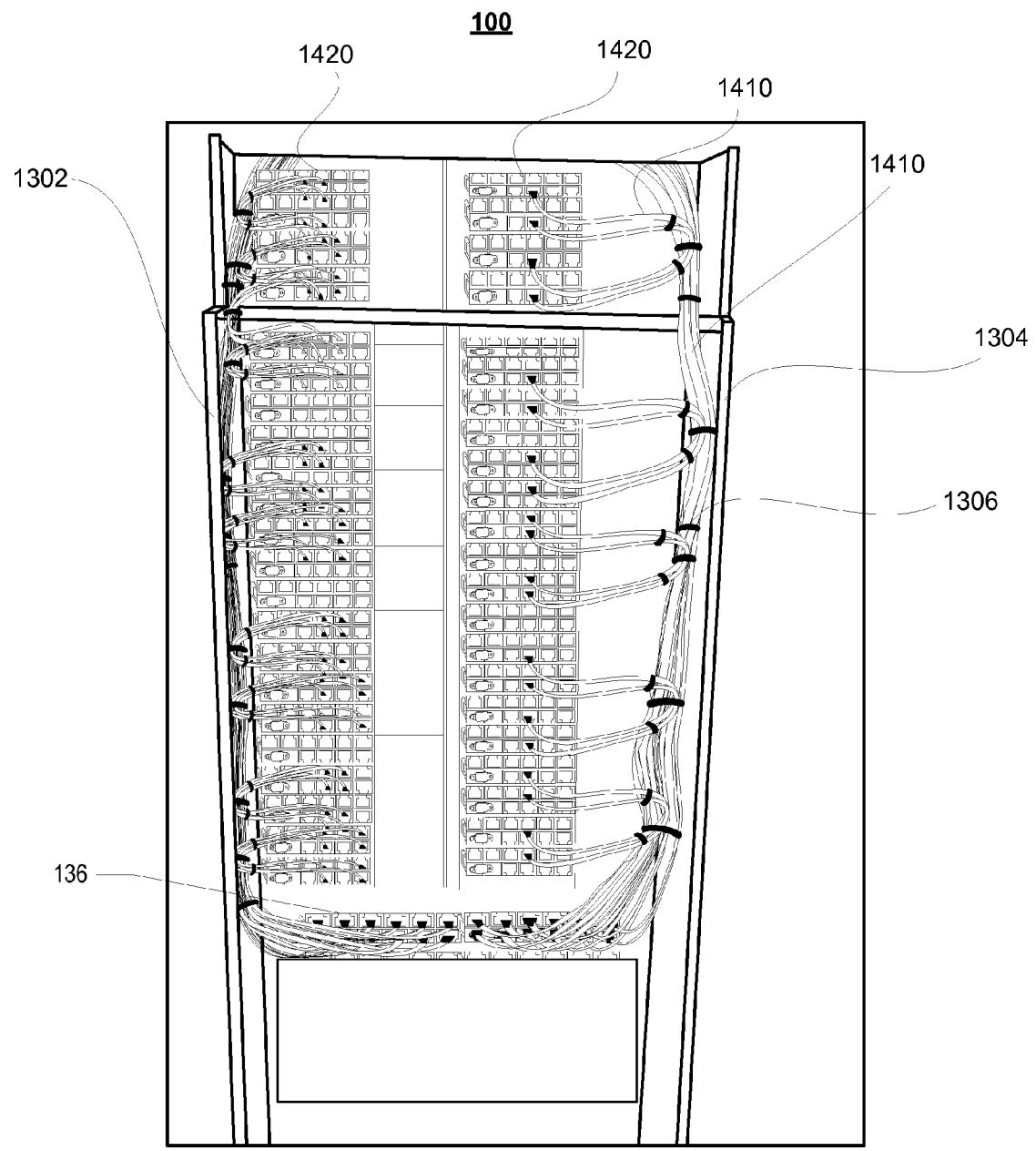

As an alternative to a moveable sleeve, another embodiment, illustrated by FIGS. 13 and 14 provides expansion panels that can be fixably attached to the front side panels of the rack chassis and extend the entire length of the rack chassis to accommodate the longest possible IT sled, while providing the cooling channels and EMI protections described above with the moveable sleeve.

FIGS. 13 and 14 illustrate example RIHS 100 having a pair of full length cable management panels 1302, 1304 attached to front section or front bay section of opposing side panels (see left side panel 212). As shown, cable management panels 1302, 1304 are respectively affixed to opposing side panels (212 shown) of rack chassis 202 as earlier described. In addition, each cable management panel 1302, 1304 includes multiple cable straps 1306 that can be utilized to physically tie the communication cabling that can extend to and/or from the IT gear 1420 placed inside of the rack chassis 1300 and particularly those cables that extend along the front of the rack chassis 1300. Each of the IT gear 1420 includes a plurality of Ethernet or other communication cables 1410 inserted therein and extending outwards from the IT gear 1420. A group of these communication cables 1410 are bundled together and tied with one of the straps 1306 at a closest one of cable management panels 1302, 1304. As shown, the use of cable management panels 1302, 1304 allows for a more orderly arrangement of the communication cables 1410 versus having all of the cables simply hang down the front access space 212 of the rack chassis 202. Notably the straps 1306 are aligned relative to the vertical locations where the Ethernet and other communication cables 1410 are receive by the IT gear 1420. These cables extend along the inside of the cable management panels 1302, 1304 away from the front access space 212 of rack chassis 202. As further shown, one end of the cables 1310 terminates within switch 136 (FIG. 1, 13) located in the area of the power and management bay, which were described and/or introduced in FIGS. 3 and 8.

Referring to FIG. 12, a fully inserted fan module within a fan bay at a back section 206 of the rack chassis 202 can result in the protrusion of the fan module. In at least one embodiment, a similar set of cable management or expansion side panels can be affixed to the back section 206 of the rack chassis 202 to accommodate longer fan bays and/or corresponding fan modules. Or other IT gear located at the back of the rack chassis. In one or more embodiments, a cable tie-bar can be attached by fasteners to support members of rack 105. The cable tie-bar is used to provide an attachment point for cables such as AC power cables which run within rack 105.

According to one embodiment, as part of the design of the rack chassis, the bay that the IT sleds are inserted into is designed with a moveable sleeve slidably coupled to the opposing front side panels of the rack chassis. These sleeves can translate forwards and backwards along the longitudinal direction of the side panels in order to accommodate IT sleds of different lengths. In one or more embodiments, the sleeves are designed to provide the proper cooling channel for the particular bay and also to provide EMI containment by shielding the otherwise exposed front sides of the IT gear. With this use of a moveable sleeve, one embodiment enables the IT sled bay to remain the same depth for all sleds and provide a modular sleeve that is placed around only the longer sleds in order to protect the exposed section of these longer sleds.

Utilizing the above physical component layout of a rack assembly, the disclosure further provides an MSE RIHS. The MSE RIHS includes a rack assembly having: a front bay chassis with height, depth and width dimensions that enable insertion and retention of a plurality of different sizes of IT gear; and a rear bay that accommodates power and cooling components to support operation of the different sizes of IT gear, where the power and cooling components are provided separate from and independent of the actual size of IT gear installed within the front bay chassis. The MSE RISH further includes at least one compute block cabinet having one or more computing nodes inserted therein to form a compute block and inserted into the front bay chassis; and a power distribution system that provides power to the one or more computing nodes of each of the at least one compute blocks.

In one or more embodiments, the MSE RIHS is configured with one or more sleeves that translate forward and backwards within the front bay chassis to accommodate insertion of IT sleds of different lengths, and particularly longer IT sleds. The sleeves are also utilized to provide both proper cooling channels for the inserted IT gear and EMI containment. The sleeves extend past a normal front edge of the front bay chassis to shield an extended, exposed section of a longer sled that is inserted into the front bay chassis.

The modularly-configured rack apparatus also includes: a plurality of block controllers each assigned to a specific block of IT gear contained in the block chassis and capable of triggering control operations at IT gear contained within a respective block; and an infrastructure manager (IM) communicatively coupled to the RMC and to each of the plurality of block controllers and which provides rack-level control signals to the plurality of block controllers and receives operational data of the IT gear from the block controllers.

According to one aspect of the disclosure, the modularity of MSE RIHS 100 includes additional panels other than the cable management panels presented by FIGS. 13-14. In one or more embodiments, these additional panels include panels that are utilized for security and other panels and bars that are provided for cable management. According to one aspect, the rack chassis is made of a structural frame that allows for scaling of accessories and attachments, as needed for the particular deployment. With this modular design can be provided cable management attachments or accessories and security screens, among other accessories that can be affixed to the structural frame or inserted within the rack chassis. The cable management attachments can be assembled to the front or rear of the rack, as needed, and can be available in many different sizes. Further, in one or more embodiments, the cable management attachments can be colored or color-coded to identify the type of cable that the attachment is designed to secure. The cable management can also include other features that can be sized for different cable types and configuration. In one embodiment, the side panels are cable management panels and can contain one or more contained and exclusive paths for uplinks to the data center. As provided by the illustrative embodiments, the cable management panels are not structural, and the panels can be added, removed, or swapped at any time with the IT gear already installed within the rack.

Thus according to one aspect of the disclosure, provided is a RIHS including at least one IT gear inserted therein and having one or more connection cables extending therefrom. The RIHS includes opposing side panels at a front opening of the RIHS, which are attached or are an extension of the rack chassis, extending past the front end of the at least one IT gear. Included in/on the opposing side panels are one or more cable management attachments. The cable management attachments enable secure holding of the cables extending from and/or running into the at least one IT gear so that the cables are not loosely located within the front opening. In one embodiment, the opposing side panels include perforated holes or connectors and the cable management attachments include zip ties inserted into the perforated holes. In other embodiments, the cable management attachments are fixably attached as permanent structures on the side panels. The cable management attachments enable rack-level cable management at the front of the rack and enables easier access to the IT gear without the confusion of cables. In one embodiment, a similar attachment of side panels is provided at the rear opening of the rack and these side panels are further configured with cable management attachments to support cable management at the rear of the rack chassis. The cables that can be managed using this configuration of cable management attachments include, but are not limited to, power cables, communication cables, such as Ethernet and Fiber cables, and the like.

Figure 16:
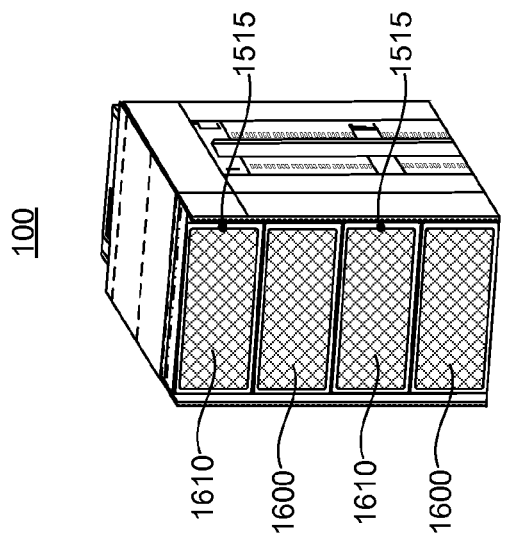
FIGS. 15 and 16 illustrate examples of modular security screens, some with locking mechanisms, attached to a face of the MSE RISH, in accordance with one or more embodiments.
Figure 15:
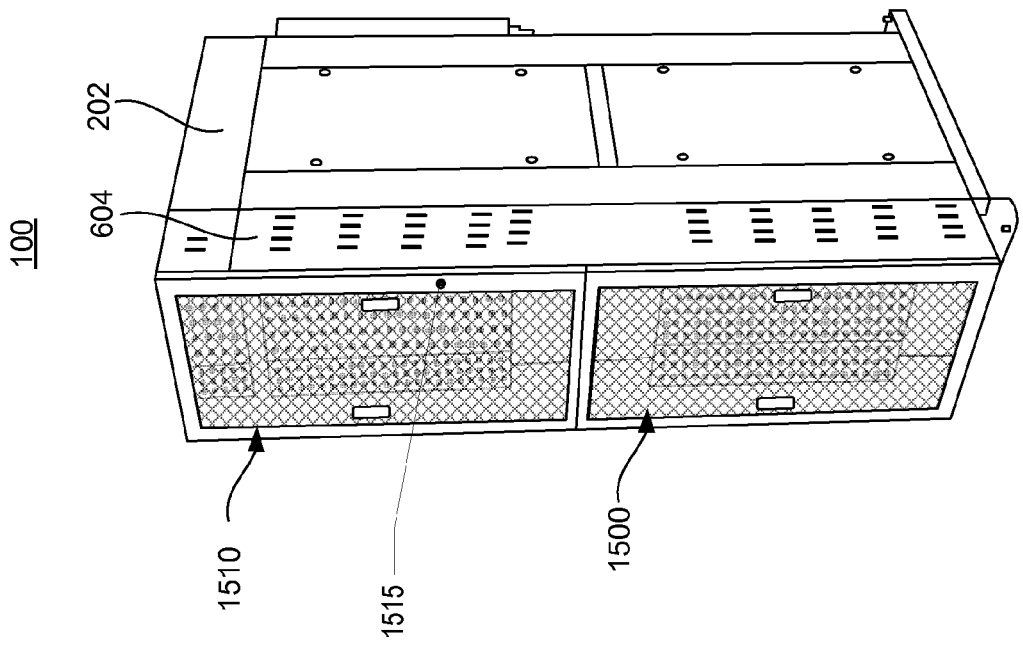

As one aspect of the modularity of the RIHS 100, one or more embodiments provide a modular application of security screens. These security screens can be utilized for protecting the processing nodes and/or preventing access to the processing nodes or other components located at the front of the RIHS 100. Additionally, the security screens can also be utilized to protect and/or prevent access to components at the back of the RIHS 100, such as the fans and the power bay and switch bay components. Referring to FIGS. 15 and 16, there are illustrated example RIHSes configured with unlocked security screens 1500 and lockable security screens 1510 placed across the front bay of the rack chassis. The security screens 1500, 1510 extend horizontally across the space between the two side panels, in front of the IT gear and other components that are placed within the rack chassis 202. FIG. 15 illustrates an example of RIHS 100 having two security screens affixed to the front face of the RIHS 100. One aspect of the modularity of the design of the RIHS 100 includes the ability to treat each block of nodes within the RIHS 100 as an independent group of processing components and to individually assign security protections to specific blocks of processing components that require such security, without having to treat all blocks the same from a security perspective. Within this context, security refers to the physical removal of the components from the RIHS 100 when the RIHS 100 is deployed outside of a controlled area or when limited access is desired for certain components within the RIHS 100, regardless of the deployment specifics (i.e., within or outside of a control area). As shown by FIG. 16, each block of processing nodes is provided its own security screen 1600, 1610 with the first and third blocks (from the top) having lockable security screens 1610, with respective locking mechanism 1615, while the second and fourth blocks are provide with non-lockable security screens 1600. By allowing the granularity of block level security screen protections, different blocks of physical components can be assigned different priorities within the RIHS 100 from a security perspective.

Thus, in accordance with one aspect of the disclosure, there is provided a rack assembly for physically supporting a rack-configured information handling system (RIHS). The rack assembly includes: an external casing comprising at least two opposing panels extending in a first direction and which are structurally held in place by one or more segments spanning between the two opposing panels to generate an internal volume between the at least two opposing panels, the internal volume having one or more structures that enable insertion and retention of information technology (IT) components of the RIHS. The rack assembly further includes at least one security screen that is removably affixed to opposing edges of the two opposing panels. The security screen operates as a shield that prevents physical access to the IT components inserted within a space extending behind the security screen, while the screen is affixed. According to at least one embodiment, the security screen is a mesh screen that allows air to pass through for cooling of the IT components located in the space. In one or more embodiments, the security screen includes a locking mechanism that securely affixes the security screen to the opposing edges of the two opposing panels. The locking mechanism further prevents removal of the security screen and/or prevents access to the space behind the security screen. In one embodiment access is restricted unless a key or unlock code is provided to unlock the locking mechanism.

The above described mechanisms provide IT gear security that does not require permanent attachment to the rack chassis. The security screens 1500, 1510 can further be removed in sections, as needed, to only expose the IT gear that needs servicing or that is being physically accessed. And, the security screens 1500, 1510 can be individually locked, such that the RIHS can be provided with multiple lock codes for different protective screens within the same rack of IT gear. As an additional aspect, the security screens 1500, 1510 allow for protection and servicing of IT gear without requiring room for swept volume upon removal. Thus, unlike a traditional rack door that is hinged and requires swept volume to open, the security screens 1500, 1510 provided by the present disclosure simply slide or snap onto the front of the rack and lock in place. These characteristics enable the security screens 1500, 1510 to operate in limited-space hot and cold isle environments. As further illustrated and described, the security screens 1500, 1510 can be perforated for air flow through the IT gear. Importantly as well, the security screens can be made into multiple sections for applications where granular security zones are desired, with each security screen being able to be locked independently. Where the security zone is the entire RIHS, a single security screen can be deployed with one or more locking mechanisms as appropriate for the particular implementation. It is further appreciated that while the functional aspects of the utilization of the security screens 1500, 1510 are described from a front-of-rack perspective, these security screens can also be equally utilized to provide physical covering and/or security for accessing components at the rear of the rack, as well.

According to one additional aspect of the disclosure, the MSE RIHS 100 includes an adapter that mounts to a non-standard rack rail width and incorporates standard 19" (EIA-310) mounting hole features. The adapter is designed to provide front to back adjustability that allows for locating IT gear to the appropriate depth relative to the non-standard equipment. Accordingly, the rack is designed with a structural frame that accepts mounting modules made to accept the different mounting standards. According to one embodiment, the rack includes side panels that can be installed in sections and are scalable for each different type of mounting standard. This use of side panels with adapters allows for the same rack chassis to accept full solutions of each IT gear mounting type. Further, the use of the adapters enables the mix and match of different standards for rack dimensions within the same rack chassis to enable scaling across different types of IT gear.

As one additional aspect, the MSE RISH includes scaled rack units that will allow for flexible installments of components within the rack. One embodiment involves providing an IT gear node height definition that provides the following functional features: (1) allows for the maximum density within an IT gear rack solution while using commodity IT gear components (e.g., DIMMS, CPUs, MBs, HDDs, etc.); allows for other components within the rack, such as the power bays, battery back-up units, switch bays, etc.) to have a height such that they scale in concert with the IT nodes; allows for easy mixing and matching with IT gear built upon other height standards (e.g., OCP, SSI, etc.); is as small as possible while still allowing proper fit of the motherboard and a standard DIMM within the IT node. Additional aspects of the design involves designing other components within the rack (power bays, battery back-up units, switch bays, etc.) to have a height built based on the IT node height unit (i.e., power bay might be 3× the node height). The node height is further defined to be easily scaled to meet existing standards (e.g., 3 GU=2 SSI RUs). This harmonization of heights across the different standards allows for maximum density when building a rack based on the GU, while allowing for scaling and mixing of GUs, OCP units, and SSI RUs without wasting excessive IT gear rack space due to misalignment.

Figure 17:
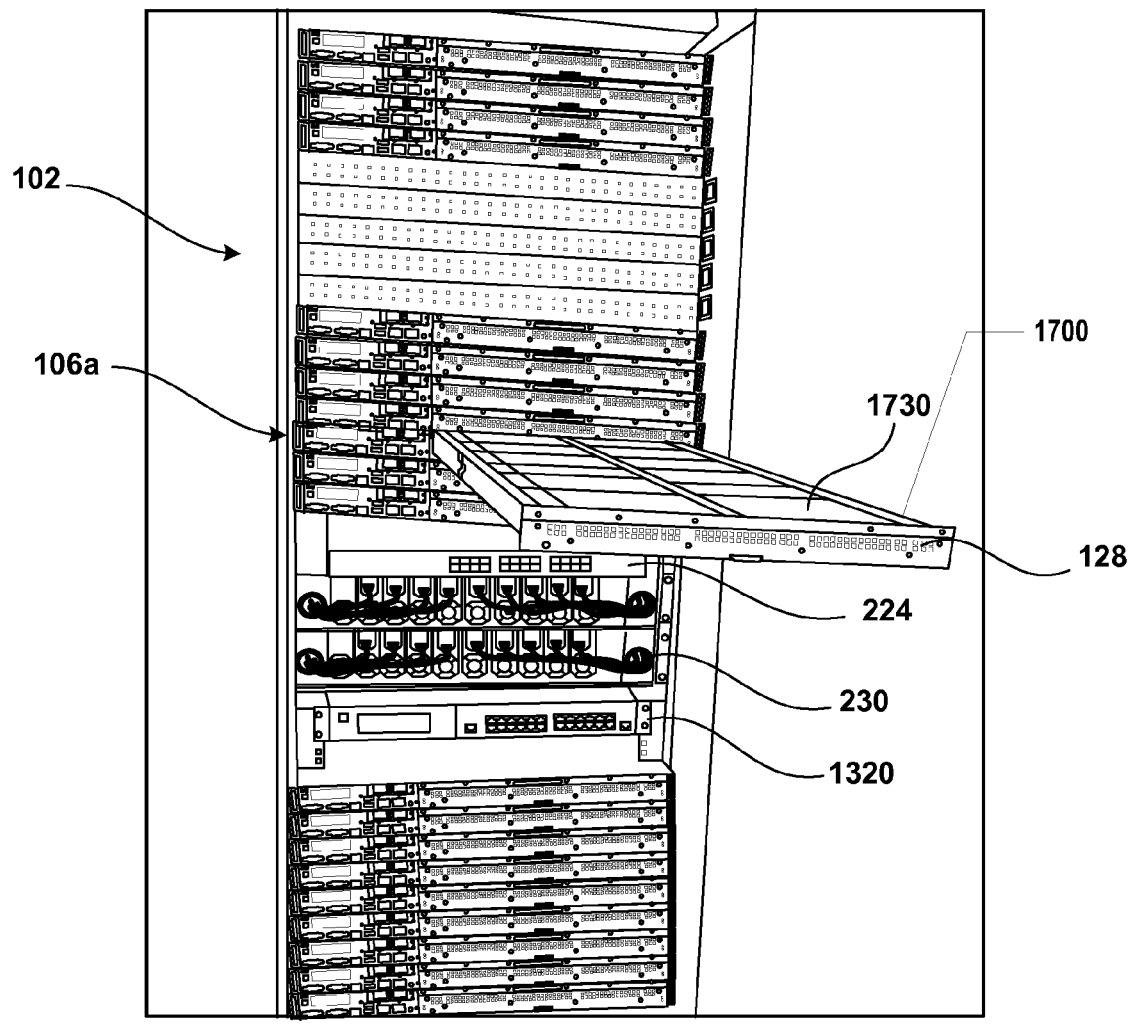
FIG. 17 illustrates an example single unit height storage sled supporting an arrangement of HDDs configured for lateral placement within the IT sled, in accordance with one embodiment.
Figure 18:
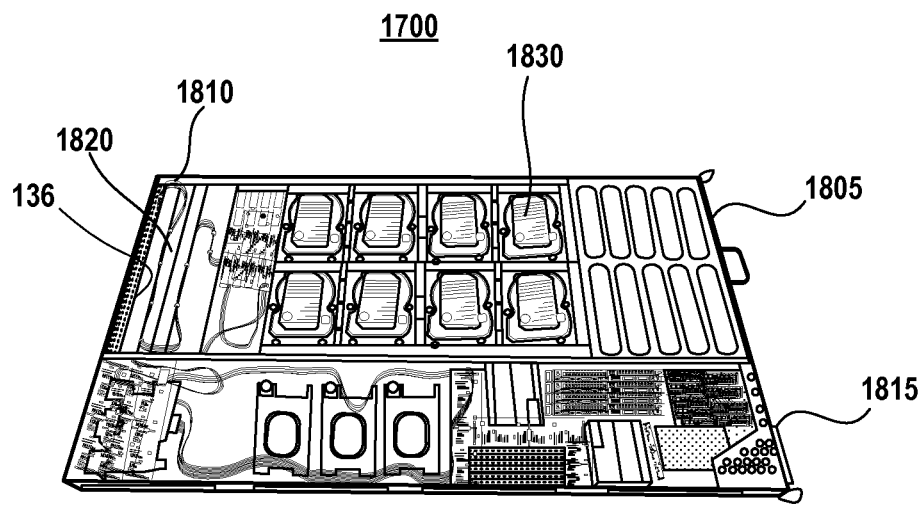
FIGS. 18 and 19 illustrate use of a cable management arm to allow for different depth IT gear within an IT sled, in accordance with one embodiment.
Figure 19:
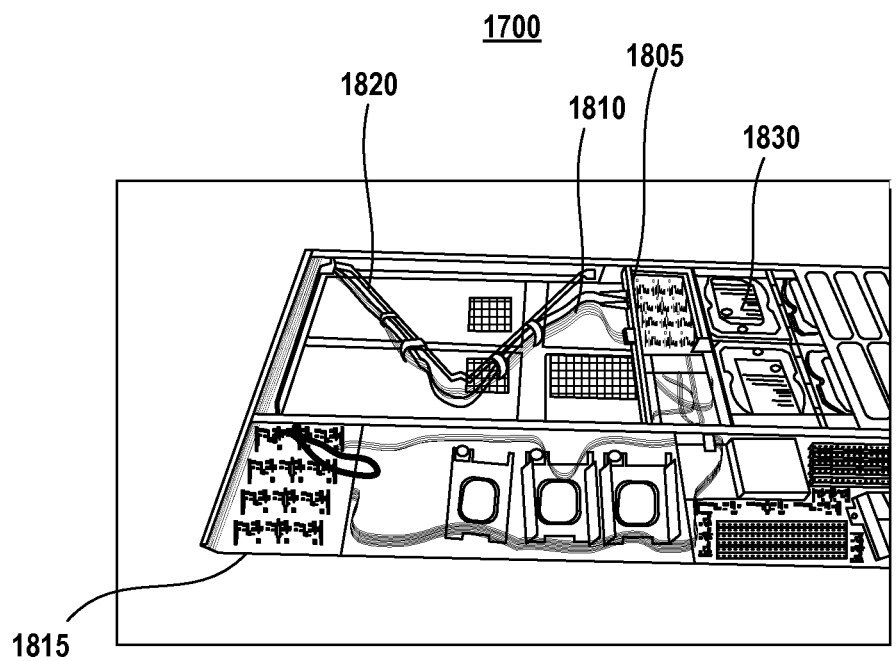

FIGS. 17-19 illustrate three views of an example storage sled that is specifically designed for use within MSE RIHS 100 to utilize a single GU unit of height within the rack chassis. As shown storage sled 1700 is inserted into rack chassis in a single GU space. Storage sled 1700 includes a movable tray 1805 that can be extended to a service position from a stationary tray 1815 to expose horizontally arrayed storage devices 1830. The movable tray 1805 is slidable and is received within the stationary tray 1815 of the storage sled 1700. One or more flexible power and signal cables 1810 reside in the stationary tray 126.

In one embodiment, the storage sled 1700 further comprises a cable extension arm 1820 to which the one or more flexible power and signals cables 1810 may be lengthwise attached. The cable extension arm 1820 may include two or more arm segments that are pivotally attached to one another. Terminal ends of cable extension arm may be pivotally attached respectively to an inner end of the stationary tray 1815 and an inserted side of the movable tray 1805. The cable extension arm 1820 is positioned to be moveable between a stowed position and a service position of the movable tray 1815. Other functional components such as drive controllers may reside in the stationary tray to communicate with and functionally support the storage devices 1830 in the movable tray 1805.

One feature of the RIHS involves the ability to provide flat packaging of the equipment rack in order to reduce the cost of shipping and storage volume required for large equipment racks, increase the number of racks shipped and/or stored in a given volume, and reduce warehouse space required to store the racks. According to one embodiment, a welded primary frame structure is created that has all the equipment mounting features, i.e., casters and leveling feet. The primary frame structure is used to create the front and rear structure of the rack, and the front and rear frame structures are attached together with bolt-on members that create the finished rack. The rack depth can be easily modified by using different length bolt-on members. According to one aspect, the primary frame member is design to nest on itself to optimize volume. Also, the bolt-on members can fit in the empty volume of the primary frame structure.

According to one embodiment, the RIHS is designed with a remote shock\humidity\temperature sensor tied into the management controller to monitor events that occur to and around the RIHS during transit. The sensor is designed with the capability of recording shock, temperature, and humidity. The sensor is powered by a small local battery that has a power life that is long enough to outlive the longest transit period expected for the device. When the rack is installed at the destination, the event log recorded by and stored within the sensor can be read by the MC and reported to IT personnel through normal validation scripts so that the sensor does not require physical handling. In one embodiment, the collected data is returned to the shipper or manufacturer tagged with the MAC ID or other identifying component of the particular RIHS. This enables the shipper to become aware of what, if any, adverse conditions were encountered during shipping of the RIHS. According to one feature, the sensor is able to report data while the RIHS is powered on, but stops collecting new data when the rack is powered down, after the small internal battery is depleted.

One or more of the design aspects of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, microcode, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed herein. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A modular, scalable/expandable (MSE) rack assembly for physically supporting information technology (IT) gear of one or more information handling systems (IHSes), the IT gear having different dimensions of at least one of height, width, and depth, the rack assembly comprising:
   a rack chassis comprising a plurality of interconnected panels forming a volumetric space having a front section and a rear section, both with opposing side panels forming a front access space and a rear access space, respectively, between corresponding opposing side panels;
   a plurality of guides located within interior surfaces of the opposing side panels at the front section, the plurality of guides running in a lateral direction along the front access space towards the rear section; and
   one or more block chasses each having a frame that provides a block height, which enables insertion of at least one layer of N fully functional IT gears within the block chassis, the frame defining a corresponding information technology (IT) bay, having a total width that enables attachment to opposing guides on the opposing side panels and configured to support insertion of one or more IT gears having at least a first size dimension selectable from among multiple supported height, width, and depth dimensions ranging from a fractional or partial width, height and depth dimension to a full height, full width, and full depth dimension of IT gear insertable into the particular block chassis, wherein the block chassis is physically inserted into the front section of the rack chassis and held in place by at least two opposing guides on the opposing side panels.

2. The MSE rack assembly of claim 1, further comprising:
   a power bay located within a segment of the rack that is specifically designed to receive one or more power bay chasses;
   a power bay chassis inserted within the power bay;
   a power and management module (PMM) slide-ably inserted into the power bay chassis and having a rear conductor plate, wherein the PMM comprises a plurality of power supply units (PSUs) that provide power to all functional components of the one or more IHSes; and
   a power busbar assembly electrically coupled to the rear conductor plate of the PMM and extendable in busbar segments along at least a length of a back of the front access space within which one or block chasses having IT gear are inserted.

3. The MSE rack assembly of claim 2, further comprising:
   at least one rack-level management controller (MC) within the PMM that operates to provide rack level control and management of the IT gear inserted within the block chasses; and
   and an infrastructure module (IM) also located within the PMM and which enables an external interfacing by the MC with other rack components, wherein the IM provides rack-level thermal and power control functions to functional components within the block chasses.

4. The MSE rack assembly of claim 3, further comprising:
   at least one block controller contained within a corresponding block chassis and communicatively coupled to one or more functional components within the corresponding block chassis and to the management controller to provide block level control for the corresponding block chassis in response to receipt of rack level control commands from the IM and the MC; and
   wherein each distinct block of IT gear within the rack assembly is supported by a specific block controller allocated to one or more of the block chasses.

5. The MSE of claim 2, wherein the IT gear are inserted into the one or more block chasses via corresponding IT sleds and the one or more block chasses are designed with rear-facing busbar connecting conductors that electrically couple to an abutting segment of the power busbar assembly to receive electrical power from the PMM when the block chassis is fully inserted from the front access space to abut the rear access space.

6. The MSE rack assembly of claim 1, further comprising:
   at least one fan bay attached to the rear section of the rack chassis, the at least one fan bay sized to receive a fan module comprising at least one and up to a plurality of individual fan units; and
   at least one fan module insertably placed within a rear cabinet, each module having at least one fan inserted therein, the at least one fan being a size dimension that is one of a plurality of different size dimensions supported by the particular fan module;
   wherein a location of each of the at least one fan bay is laterally adjacent to a location of each block chassis defined within the front section of the rack chassis to enable direct cooling of specific IT gear located within the adjacent block chassis to the fan bay.

7. The MSE rack assembly of claim 6, wherein:
   a configuration of the at least one fan within a fan module is one of a plurality of different fan configurations that are individually supported by the rack fan bay; and
   the rack assembly further comprises at least one fan controller that is configurable to control each of the plurality of different fan configurations and which, in response to detecting a first fan configuration of a first fan module inserted within a first fan bay receptacle, activates a corresponding first control algorithm that enables the detected first fan configuration to be utilized to provide direct cooling for one or more of the IT gear inserted within the rack adjacent to a location of the fan bay.

8. The MSE rack assembly of claim 1, wherein the front section of the rack chassis further comprises:
   a plurality of attachments on opposing side rails of the opposing side panels which enable slide-able insertion and removal of one of a single unit height IT gear and a block chassis that has greater than a single unit height, wherein the plurality of attachments are vertically spaced at one of (a) single unit heights corresponding to a smallest height IT gear and (b) larger units of height to accommodate insertion of different heights of IT gear.

9. The MSE rack assembly of claim 1, wherein each of the plurality of guides along each panel of the opposing side panels are separated from a closest adjacent guide by at least a first unit of height that is sufficient to accommodate insertion of a smallest standard height information technology (IT) gear chassis within the front section, wherein the guides are designed to enable insertion of at least one second height IT gear chassis that is larger than the smallest standard height, to enable the rack assembly to simultaneously accommodate multiple different heights of IT gear chasses within the front section of the rack assembly.

10. The MSE rack assembly of claim 9, wherein:
a height of a block chassis is substantially equal to a whole number multiple of a sled height of a smallest standard height IT gear; and
when the IT gear is a first height that is less than the block height, the block chassis supports two or more vertically adjacent layers of IT gear; and
the MSE rack assembly comprises a single block controller that controls operations of all components within the block chassis.

11. The MSE rack assembly of claim 10, further comprising:
at least one standard height IT gear sled slide-ably inserted into a first segment of the front access space between adjacent guides on opposing side panels of the front section; and
at least one second height IT gear chassis slide-ably inserted into a second segment of the front access space between non-adjacent guides on opposing side panels of the front section.

12. The MSE rack assembly of claim 1, wherein the block chassis enables insertion of a select one of multiple different widths of IT gear ranging from a full width IT gear to a fractional (1/N) width IT gear, where N is an integer greater than 1.

13. The MSE rack assembly of claim 12, wherein the block chassis enables a hybrid arrangement of IT gear including at least two different widths of IT gear from among the multiple different widths of IT gear, in different sled layers within the one block chassis, where each sled layer includes only a single-sized width IT gear.

14. The MSE rack assembly of claim 12, wherein:
N is an integer from among a group comprising 1, 2, and 3;
when N=1, the MSE rack assembly includes full width IT gear;
when N=2, the MSE rack assembly comprises at least one block chassis having one or more layers of two (2) side-by-side fully functional IT gears inserted therein, wherein the two side-by-side fully functional IT gears comprise two one-half width IT gear that are one half a size of a standard width IT gear; and
when N=3, the MSE rack assembly comprises at least one block chassis having one or more layers of three (3) side-by-side fully functional IT gears inserted therein, wherein the three side-by-side fully functional IT gears comprise three one-third widths IT gear that are one third a size of a standard width IT gear.

15. The MSE rack assembly of claim 1, further comprising:
at least one longer IT sled having a length that causes the IT sled to extend beyond a depth of the front access space of the rack chassis when fully inserted within the front access space; and
opposing, extendable and retractable side sleeves that can be pulled to an extended position to protect the extended portion of the at least one longer IT sled, wherein the sleeves are retractable within the rack chassis when not required for insertion of standard length IT sleds.

16. The MSE rack assembly of claim 1, further comprising:
at least one attachment affordance provided at each of the opposing side panels at the front section and the back section; and
a pair of front expansion panels that are affixed to the rack chassis via the at least one attachment affordance and which extend past an end of the opposing side panels at the front section of the rack chassis to provide a deeper IT bay within the front section and enable insertion of longer-than-standard depth IT gear within the rack chassis, wherein the pair of front expansion panels are removably affixed via connecting affordances to the opposing side panels.

17. The MSE rack assembly of claim 16, further comprising:
one or more IT sleds that extend beyond a front end of the opposing side panels when fully inserted into the front access space, wherein the pair of front expansion panels extend past an exposed end of one or more IT sleds to protect an extended section of the one or more IT sleds.

18. The MSE rack assembly of claim 16, wherein the pair of front expansion panels are cable management panels having one or more cable straps that enable collection and bundling of communication and power cables for IT gear located within the front access space at which the cable management extensions are attached.

19. The MSE rack assembly of claim 18, further comprising at least one security screen that is removably affixed to opposing edges of the two front expansion panels to shield the IT components inserted within a space extending behind the security screen from physical access while the screen is affixed.

20. The rack assembly of claim 18, wherein the at least one security screen is a mesh screen that allows air to pass through for cooling of the IT components located in the space and the at least one security screen comprises a locking mechanism that securely affixes the security screen to the opposing edges of the two opposing panels and which prevents removal of the security screen and access to the space without a key to unlock the locking mechanism.

21. The modular, expandable rack assembly of claim 18, further comprising a set of modular security screens affixed to a front edge of the opposing side panels, wherein the security screens are independent of each other and can be applied and locked independent of other security screens on the rack assembly.

22. A modular, scalable, and expandable (MSE), rack-based information handling system (RIHS) comprising:
a rack assembly having a frame that defines:
(1) a front bay chassis with height, depth and width dimensions that enable insertion and retention of a plurality of different sizes of IT gear and which provides a plurality of individual blocks of a pre-defined height;
(2) a rear bay that accommodates power and cooling components to support operation of the different sizes of IT gear, wherein the power and cooling components are provided separate from and independent of the actual size of IT gear installed within the front bay chassis and are assigned at a block level;
(3) a power and management bay for receiving one or more power and management components and extending from the front bay chassis into the rear bay; and
(4) a switch bay for receiving one or more switches and extending from the front bay chassis into the rear bay;
a plurality of information technology (IT) gear contained within one or more IT sleds slide-ably inserted into one or more blocks of the front bay chassis;
one or more sleds providing a switch and inserted into the switch bay;

one or more power and management sleds providing a combined power and management module (PMM) and inserted into the power and management bay; and a rack-level management controller (MC) having firmware that enables the MC to control power allocation and cooling operations for the plurality of IT gear from a rack-level.

23. The MSE RIHS of claim 22, further comprising:

a plurality of block controllers each assigned to a specific block of IT gear contained in a block chassis and capable of triggering control operations for the IT gear contained within the specific block; and an infrastructure manager (IM) communicatively coupled to the MC and to each of the plurality of block controllers and which provides rack-level control signals to the plurality of block controllers and receives operational data of the IT gear from the block controllers.

24. The MSE RIHS of claim 22, wherein the rear bay comprises:

at least one fan cabinet located adjacent to a back section of an adjacent block chassis within the front bay chassis; and at least one fan module insertably placed within the fan cabinet and communicatively coupled to the block controller of the adjacent block to provide block level cooling of IT gear inserted within the IT block.

25. The MSE RIHS of claim 22, further comprising a power distribution system including:

one or more power supply units (PSUs) contained in the power bay module extending from the front bay chassis to the rear chassis and which provides electrical power for the IT gear and other functional components contained within the RIHS;

a power distribution component electrically coupled to the one or more PSUs;

a modular bus bar assembly electrically coupled between the power distribution component and a rear cabinet space of the block chassis; and one or more power interface boards contained in the block chassis inserted within the front bay chassis, the power interface board electrically coupled to the modular bus bar assembly and to the IT gear contained within the block chassis.

26. The MSE RIHS of claim 22, further comprising:

at least one longer IT sled having a length that causes the IT sled to extend beyond a depth of the front access space of the rack chassis when fully inserted within the front access space; and opposing, extendable and retractable side sleeves that can be pulled to an extended position to protect the extended portion of the at least one longer IT sled, wherein the sleeves are retractable within the rack chassis when not required for insertion of standard length IT sleds.

27. The MSE RIHS of claim 22, wherein the plurality of IT gear comprises a hybrid combination of IT gear having one or more of different height, width, and length that are all accommodated within respective IT sleds inserted within a block chassis of the MSE RIHS, wherein the different height, width, and length IT gear are accommodated using a combination of peripheral attachments and affordances provided within the rack chassis and use of a segmented power bus bar to allow each IT sled to electrically connect to and receive system power at the rear of the front bay once the IT sled is fully inserted into the front bay.

\* \* \* \* \*